(12) United States Patent
Takada et al.

(10) Patent No.: US 11,901,020 B2
(45) Date of Patent: Feb. 13, 2024

(54) SEMICONDUCTOR STORAGE DEVICE COMPRISING A CONTROL CIRCUIT FOR CHANGING A RATE OF INCREASE OF A VOLTAGE APPLIED TO NON-SELECTED WORD LINES

(71) Applicant: KIOXIA CORPORATION, Tokyo (JP)

(72) Inventors: Emiri Takada, Hiratsuka Kanagawa (JP); Naofumi Abiko, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/459,712

(22) Filed: Aug. 27, 2021

(65) Prior Publication Data
US 2022/0284972 A1    Sep. 8, 2022

(30) Foreign Application Priority Data
Mar. 3, 2021  (JP) .................................. 2021-033303

(51) Int. Cl.
| | | |
|---|---|---|
| G11C 16/34 | (2006.01) | |
| G11C 16/10 | (2006.01) | |
| G11C 16/04 | (2006.01) | |
| G11C 16/08 | (2006.01) | |
| G11C 16/26 | (2006.01) | |

(52) U.S. Cl.
CPC ...... G11C 16/3459 (2013.01); G11C 16/0433 (2013.01); G11C 16/08 (2013.01); G11C 16/102 (2013.01); G11C 16/26 (2013.01)

(58) Field of Classification Search
CPC . G11C 16/3459; G11C 16/3481; G11C 16/08; G11C 16/102; G11C 16/26
See application file for complete search history.

(56) References Cited

U.S. PATENT DOCUMENTS

| | | | |
|---|---|---|---|
| 8,854,891 B2* | 10/2014 | Aritome ................. | G11C 16/10 365/185.18 |
| 10,586,599 B1 | 3/2020 | Kubota et al. | |
| 2020/0090741 A1* | 3/2020 | Suzuki ................ | G06F 11/1048 |
| 2022/0319605 A1* | 10/2022 | Lien ....................... | G11C 16/26 |

FOREIGN PATENT DOCUMENTS

| | | |
|---|---|---|
| JP | 2020-047329 A | 3/2020 |
| JP | 2020-102286 A | 7/2020 |

* cited by examiner

*Primary Examiner* — Kretelia Graham
(74) *Attorney, Agent, or Firm* — Kim & Stewart LLP

(57) ABSTRACT

[Problem] To provide a semiconductor storage device capable of reducing the load on a controller.
[Solution] According to one embodiment, a semiconductor storage device 2 includes a memory cell array 110 including a plurality of memory cell transistors MT, a plurality of word lines WL connected to gates of the respective memory cell arrays 110, a voltage generation circuit 43 generating a voltage applied to each of the word lines WL, and a sequencer 41 controlling an operation of the memory cell array 110. The sequencer 41 repeats a loop including a program operation and a verify operation multiple times in a write operation. The sequencer 41 controls an operation of the voltage generation circuit 43 so that a rate increase in a voltage applied to a non-selected word line in the verify operation of a last loop is smaller than the rate increase in the voltage applied to the non-selected word line in the verify operation of a first loop.

20 Claims, 13 Drawing Sheets

(PRIOR ART)

(PRIOR ART)

(PRIOR ART)

FIG. 9A

| VERIFY TARGET STATE \ NUMBER OF TIMES OF LOOP | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" state (VfyA) | O | O | O | O | O | O | | | | | | | | | | | | | |
| "B" state (VfyB) | | | O | O | O | O | O | O | | | | | | | | | | | |
| "C" state (VfyC) | | | | | O | O | O | O | O | O | | | | | | | | | |
| "D" state (VfyD) | | | | | | | O | O | O | O | O | O | | | | | | | |
| "E" state (VfyE) | | | | | | | | | O | O | O | O | O | O | | | | | |
| "F" state (VfyF) | | | | | | | | | | | O | O | O | O | O | O | | | |
| "G" state (VfyG) | | | | | | | | | | | | | | O | O | O | O | O | O |

(PRIOR ART)

FIG. 9B

| PROGRAM TARGET STATE \ NUMBER OF TIMES OF LOOP | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "ER" state (inhibit) | 1 | 1 | 1 | 1 | 1 | 1 | 1 | 1 | 1 | 1 | 1 | 1 | 1 | 1 | 1 | 1 | 1 | 1 | 1 |
| "A" state | 0 | 0/10/10/1 | 0 | 0 | 0 | 0 | 0 | 0 | 0 | 0 | 0 | 0 | 0 | 0 | 0 | 0 | 0 | 0 | 0 |
| "B" state | 0 | 0 | 0 | 0/10/10/10/10/1 | 0 | 0 | 0 | 0 | 0 | 0 | 0 | 0 | 0 | 0 | 0 | 0 | 0 | 0 |
| "C" state | 0 | 0 | 0 | 0 | 0 | 0/10/10/10/10/1 | 0 | 0 | 0 | 0 | 0 | 0 | 0 | 0 | 0 | 0 | 0 | 0 |
| "D" state | 0 | 0 | 0 | 0 | 0 | 0 | 0 | 0/10/10/10/10/1 | 0 | 0 | 0 | 0 | 0 | 0 | 0 | 0 | 0 | 0 |
| "E" state | 0 | 0 | 0 | 0 | 0 | 0 | 0 | 0 | 0 | 0/10/10/10/10/1 | 0 | 0 | 0 | 0 | 0 | 0 | 0 | 0 |
| "F" state | 0 | 0 | 0 | 0 | 0 | 0 | 0 | 0 | 0 | 0 | 0 | 0 | 0/10/10/10/10/1 | 0 | 0 | 0 | 0 | 0 |
| "G" state | 0 | 0 | 0 | 0 | 0 | 0 | 0 | 0 | 0 | 0 | 0 | 0 | 0 | 0 | 0/10/10/10/10/1 | 0 | 0 | 0 |

(PRIOR ART)

SEMICONDUCTOR STORAGE DEVICE COMPRISING A CONTROL CIRCUIT FOR CHANGING A RATE OF INCREASE OF A VOLTAGE APPLIED TO NON-SELECTED WORD LINES

CROSS-REFERENCE TO RELATED APPLICATION

This application is based upon and claims the benefit of priority from Japanese Patent Application No. 2021-033303, filed Mar. 3, 2021, the entire contents of which are incorporated herein by reference.

FIELD

Embodiments described herein relate generally to a semiconductor storage device.

BACKGROUND

In a semiconductor storage device such as a NAND flash memory, data is stored in a memory cell array. In such a semiconductor storage device, a program operation and a verify operation are repeatedly performed when writing data to the memory cell array.

BRIEF DESCRIPTION OF THE DRAWINGS

FIG. 9A is a diagram illustrating a relationship between the number of times of loop and a verify operation during the write operation.

FIG. 9B is a diagram illustrating a relationship between the number of times of loop and a program operation during the write operation.

DETAILED DESCRIPTION

Embodiments provide a semiconductor storage device capable of reducing a load on a controller.

In general, according to one embodiment, there is provided a semiconductor storage device including: a memory cell array including a plurality of memory cell transistors; a plurality of word lines connected to gates of the memory cell transistors; a voltage generation circuit configured to generate a voltage applied to each of the word lines; and a control circuit configured to control an operation of the memory cell array. In a write operation for writing data to the memory cell array that includes multiple loops of a program operation and a verify operation, the control circuit controls an operation of the voltage generation circuit so that a rate of increase of a voltage applied to a non-selected word line at a beginning of the verify operation is different for at least two of the loops.

Hereinafter, the present embodiments will be described with reference to the accompanying drawings. In order to facilitate understanding of the description, the same components are denoted by the same reference signs as much as possible in each drawing, and duplicate description is omitted.

Figure 1:
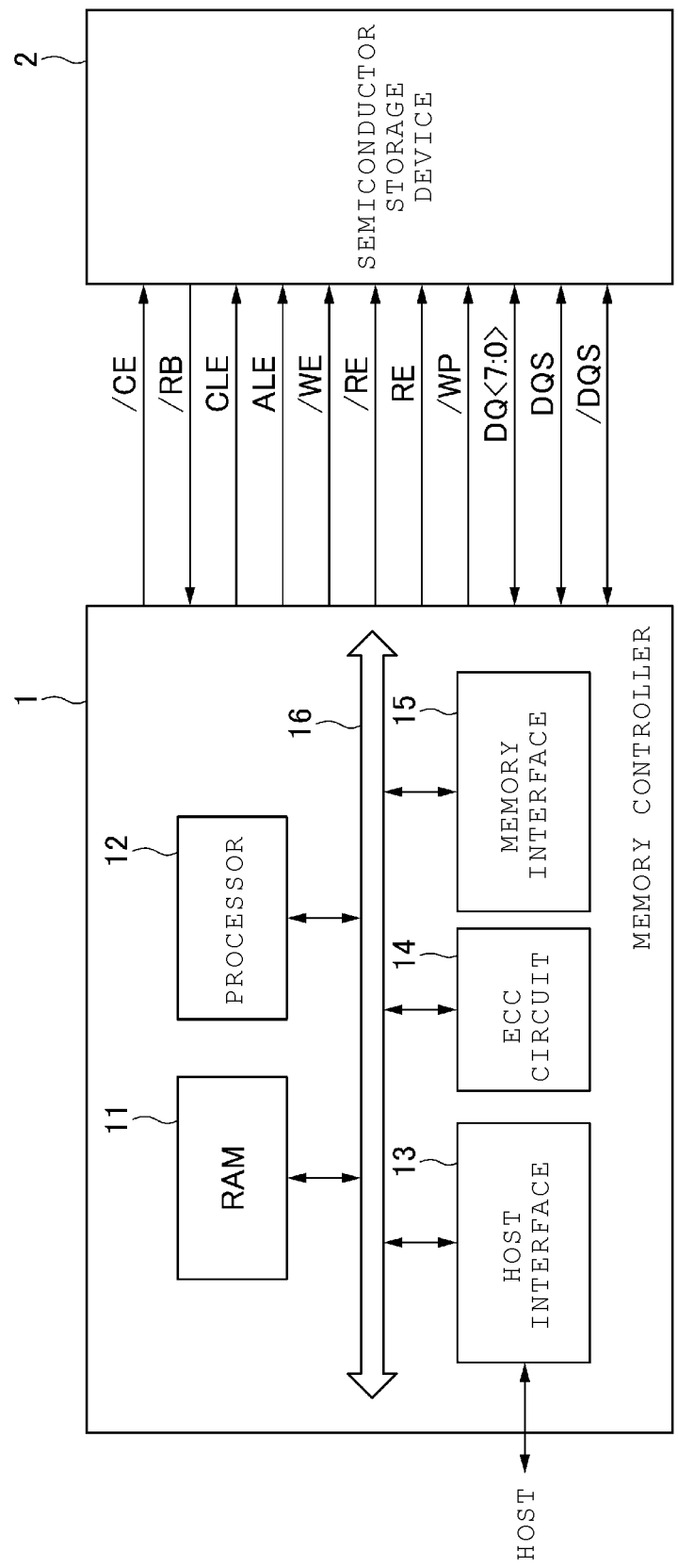
FIG. 1 is a block diagram illustrating a configuration example of a memory system according to an embodiment.

A first embodiment will be described. A semiconductor storage device 2 according to the present embodiment is a non-volatile storage device configured as a NAND flash memory. FIG. 1 illustrates a configuration example of a memory system including the semiconductor storage device 2 as a block diagram. The memory system includes a memory controller 1 and the semiconductor storage device 2. It is noted that, although a plurality of the semiconductor storage devices 2 are actually provided in the memory system of FIG. 1, only one of the semiconductor storage devices 2 is illustrated in FIG. 1. A specific configuration of the semiconductor storage device 2 will be described later. The memory system may be connected to a host (not illustrated). The host is, for example, an electronic device such as a personal computer or a mobile terminal.

The memory controller 1 controls writing of data to the semiconductor storage device 2 according to a write request from the host. In addition, the memory controller 1 controls reading of data from the semiconductor storage device 2 according to a read request from the host.

A chip enable signal /CE, a ready busy signal /RB, a command latch enable signal CLE, an address latch enable signal ALE, a write enable signal /WE, read enable signals RE and /RE, a write protect signal /WP, a data signal DQ<7:0>, and data strobe signals DQS and /DQS are transmitted and received between the memory controller 1 and the semiconductor storage device 2.

The chip enable signal /CE is a signal for enabling the semiconductor storage device 2. The ready busy signal /RB is a signal for indicating whether the semiconductor storage device 2 is in a ready state or a busy state. The "ready state" is a state in which an external command can be received. The "busy state" is a state in which the external command cannot be received. The command latch enable signal CLE is a signal indicating that the signal DQ<7:0> is a command. The address latch enable signal ALE is a signal indicating that the signal DQ<7:0> is an address. The write enable signal /WE is a signal for capturing the received signal into the semiconductor storage device 2 and is asserted each time a command, an address, and a data are received by the memory controller 1. The memory controller 1 instructs the semiconductor storage device 2 to capture the signal DQ<7:0> while the signal /WE is at the "L (Low)" level.

The read enable signals RE and /RE are signals for the memory controller 1 to read data from the semiconductor storage device 2. The signals are used, for example, to control an operation timing of the semiconductor storage device 2 when outputting the signal DQ<7:0>. The write protect signal /WP is a signal for instructing the semiconductor storage device 2 to prohibit data writing and erasing. The signal DQ<7:0> is the data transmitted and received between the semiconductor storage device 2 and the memory controller 1 and includes commands, addresses, and data. The data strobe signals DQS and /DQS are signals for controlling an input/output timing of the signal DQ<7:0>.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request received from the host, a user data (e.g., write data) received from the host, and the like to the internal bus 16. In addition, the host interface 13 transmits the user data read from the semiconductor storage device 2, a response from the processor 12, and the like to the host.

The memory interface 15 controls a process of writing the user data or the like to the semiconductor storage device 2 and a process of reading the user data from the semiconductor storage device 2 based on an instruction of the processor 12.

The processor 12 controls the memory controller 1. The processor 12 is, for example, a CPU, an MPU, or the like. When the processor 12 receives the request from the host via the host interface 13, the processor 12 controls the memory controller 1 according to the request. For example, the processor 12 instructs the memory interface 15 to write the user data and a parity to the semiconductor storage device 2 according to the request from the host. In addition, the processor 12 instructs the memory interface 15 to read the user data and the parity from the semiconductor storage device 2 according to the request from the host.

The processor 12 determines a storage region (also referred to as memory region) on the semiconductor storage device 2 with respect to the user data stored in the RAM 11. The user data is stored in the RAM 11 via the internal bus 16. The processor 12 determines the memory region for data of one page, which is a unit of writing. The user data stored in one page of the semiconductor storage device 2 is also referred to as a "unit data", hereinafter. The unit data is generally encoded and stored in the semiconductor storage device 2 as a code word. In the present embodiment, the encoding is optional. The memory controller 1 may store the unit data in the semiconductor storage device 2 without encoding, but FIG. 1 illustrates a configuration example in which encoding is performed. When the memory controller 1 does not encode, the page data matches the unit data. In addition, one code word may be generated based on one unit data, or one code word may be generated based on the divided data obtained by dividing the unit data. In addition, one code word may be generated by using a plurality of the unit data.

The processor 12 determines the memory region of the semiconductor storage device 2 of a write destination for each unit data. A physical address is allocated to the memory region of the semiconductor storage device 2. The processor 12 manages the memory region of the write destination of the unit data by using the physical address. The processor 12 designates the determined memory region (i.e., the allocated physical address) and instructs the memory interface 15 to write the user data to the semiconductor storage device 2. The processor 12 manages the correspondence between a logical address (e.g., logical address managed by the host) of the user data and the physical address. When the processor 12 receives a read request including the logical address from the host, the processor 12 specifies the physical address corresponding to the logical address, designates the physical address, and instructs the memory interface 15 to read the user data.

The ECC circuit 14 encodes the user data stored in the RAM 11 to generate the code word. In addition, the ECC circuit 14 decodes the code word read from the semiconductor storage device 2.

The RAM 11 temporarily stores the user data received from the host until the user data is stored in the semiconductor storage device 2 or temporarily stores the data read from the semiconductor storage device 2 until the data is transmitted to the host. The RAM 11 is, for example, a general-purpose memory such as an SRAM or a DRAM.

FIG. 1 illustrates a configuration example in which the memory controller 1 includes the ECC circuit 14 and the memory interface 15, respectively. However, the ECC circuit 14 may be embedded in the memory interface 15. In addition, the ECC circuit 14 may be embedded in the semiconductor storage device 2. The configuration and arrangement of each element are not limited to those illustrated in FIG. 1.

When the write request is received from the host, the memory system of FIG. 1 operates as follows. The processor 12 temporarily stores the data that is the target of the write operation in the RAM 11. The processor 12 reads the data stored in the RAM 11 and inputs the data to the ECC circuit 14. The ECC circuit 14 encodes the input data and inputs the code word to the memory interface 15. The memory interface 15 writes the input code word to the semiconductor storage device 2.

When the read request is received from the host, the memory system of FIG. 1 operates as follows. The memory interface 15 inputs the code word read from the semiconductor storage device 2 to the ECC circuit 14. The ECC circuit 14 decodes the input code word and stores the decoded data in the RAM 11. The processor 12 transmits the data stored in the RAM 11 to the host via the host interface 13.

Figure 2:
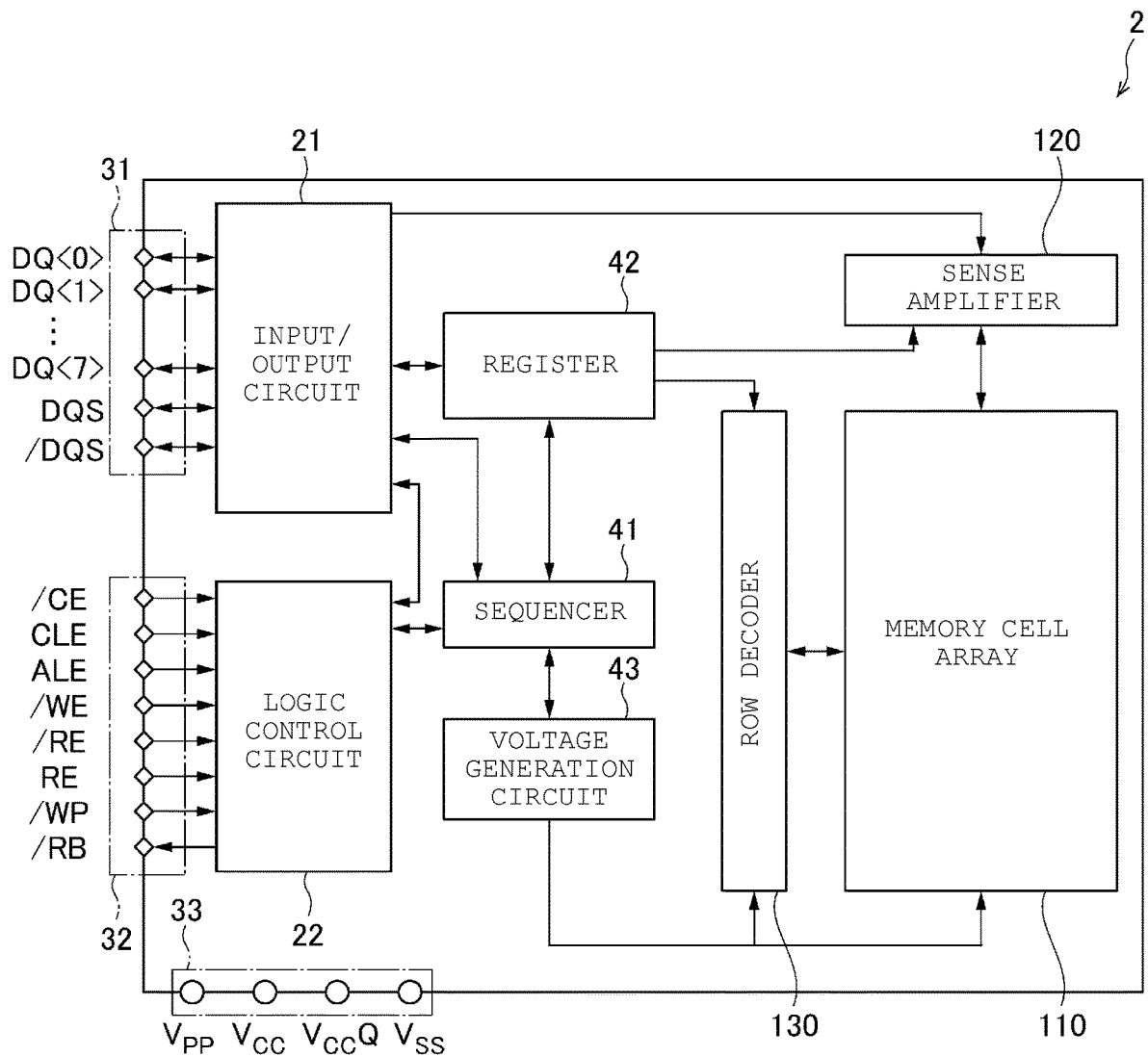
FIG. 2 is a block diagram illustrating a configuration of a semiconductor storage device according to an embodiment.

A configuration of the semiconductor storage device 2 will be described. As illustrated in FIG. 2, the semiconductor storage device 2 includes a memory cell array 110, a sense amplifier 120, a row decoder 130, an input/output circuit 21, a logic control circuit 22, a sequencer 41, a register 42, a voltage generation circuit 43, an input/output pad group 31, a logic control pad group 32, and a power input terminal group 33.

Figure 3:
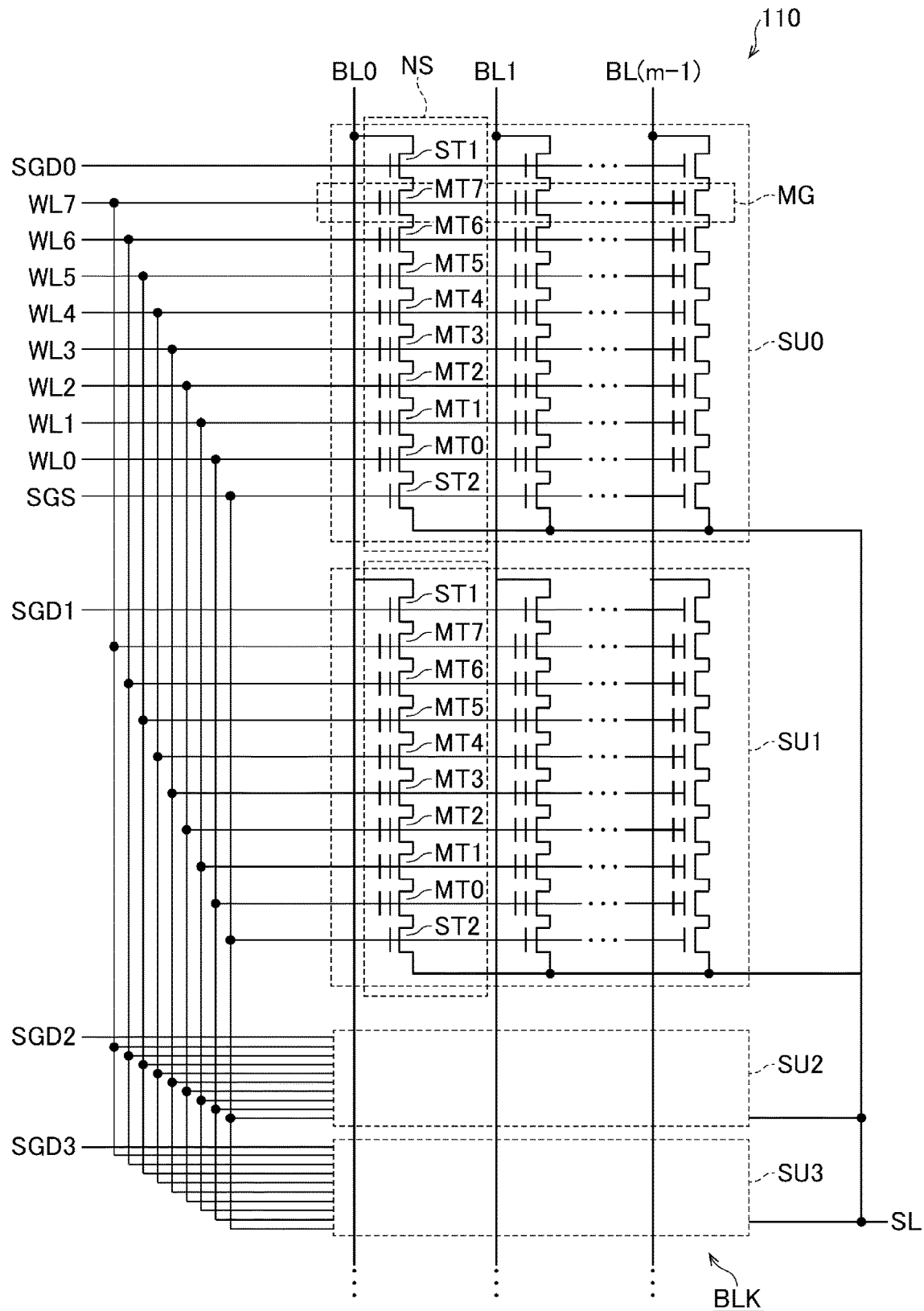
FIG. 3 is an equivalent circuit diagram illustrating a configuration of a memory cell array.

A memory cell array 110 stores data. FIG. 3 illustrates an equivalent circuit diagram of a configuration of the memory cell array 110. The memory cell array 110 is configured with a plurality of blocks BLK, but in FIG. 3, only one of these blocks BLK is illustrated. The configuration of the other blocks BLK in the memory cell array 110 is also the same as that illustrated in FIG. 3.

As illustrated in FIG. 3, the block BLK includes, for example, four string units SU (SU0 to SU3). In addition, each string unit SU includes a plurality of NAND strings NS. Each of the NAND strings NS includes, for example, eight memory cell transistors MT (MT0 to MT7) and select transistors ST1 and ST2.

It is noted that the number of memory cell transistors MT is not limited to eight, and may be, for example, 32, 48, 64, or 96. For example, in order to improve cutoff characteristics, each of the select transistors ST1 and ST2 may be configured with a plurality of transistors instead of a single transistor. Furthermore, a dummy cell transistor may be provided between a memory cell transistor MT and the select transistors ST1 and ST2.

The memory cell transistor MT is connected in series between the select transistor ST1 and the select transistor ST2. A memory cell transistor MT7 on one end side is connected to the source of the select transistor ST1, and a memory cell transistor MT0 on the other end side is connected to the drain of the select transistor ST2.

The gate of the select transistor ST1 of each of the string units SU0 to SU3 is commonly connected to the select gate lines SGD0 to SGD3, respectively. The gate of the select transistor ST2 is commonly connected to the same select gate line SGS across the plurality of string units SU in the same block BLK. The control gates of the memory cell transistors MT0 to MT7 in the same block BLK are commonly connected to the word lines WL0 to WL7, respectively. That is, the word lines WL0 to WL7 and the select gate line SGS are common across the plurality of string units SU0 to SU3 in the same block BLK, whereas the select gate line SGD is provided individually for each of the string units SU0 to SU3 even in the same block BLK.

The memory cell array 110 is provided with m bit lines BL (BL0, BL1, . . . , BL(m−1)). The above-mentioned "m" is an integer representing the number of NAND strings NS in one string unit SU. In each of the NAND strings NS, the drain of the select transistor ST1 is connected to the corresponding bit line BL. The source of the select transistor ST2 is connected to a source line SL. The source line SL is commonly connected to the sources of the plurality of select transistors ST2 in the block BLK.

The data stored in the plurality of memory cell transistors MT in the same block BLK are collectively erased. On the other hand, reading and writing of data are collectively performed for the plurality of memory cell transistors MT connected to one word line WL and belonging to one string unit SU. Each memory cell can store a 3-bit data configured with a high order bit, a middle order bit, and a low order bit.

That is, the semiconductor storage device 2 according to the present embodiment employs a TLC method for storing the 3-bit data in one memory cell transistor MT as a method for writing data to the memory cell transistor MT. Alternatively, as a method of writing data to the memory cell transistor MT, an MLC method for storing a 2-bit data in one memory cell transistor MT, an SLC method for storing a 1-bit data in one memory cell transistor MT, or the like may be employed.

It is noted that, in the following description, a set of 1-bit data stored by the plurality of memory cell transistors MT that are connected to one word line WL and belong to one string unit SU is referred to as a "page". In FIG. 3, a corresponding set of the plurality of memory cell transistors MT is denoted by a reference numeral "MG".

When a 3-bit data is stored in one memory cell transistor MT as in the present embodiment, a set of the plurality of memory cell transistors MT connected to a common word line WL in one string unit SU can store data for three pages.

Figure 4:
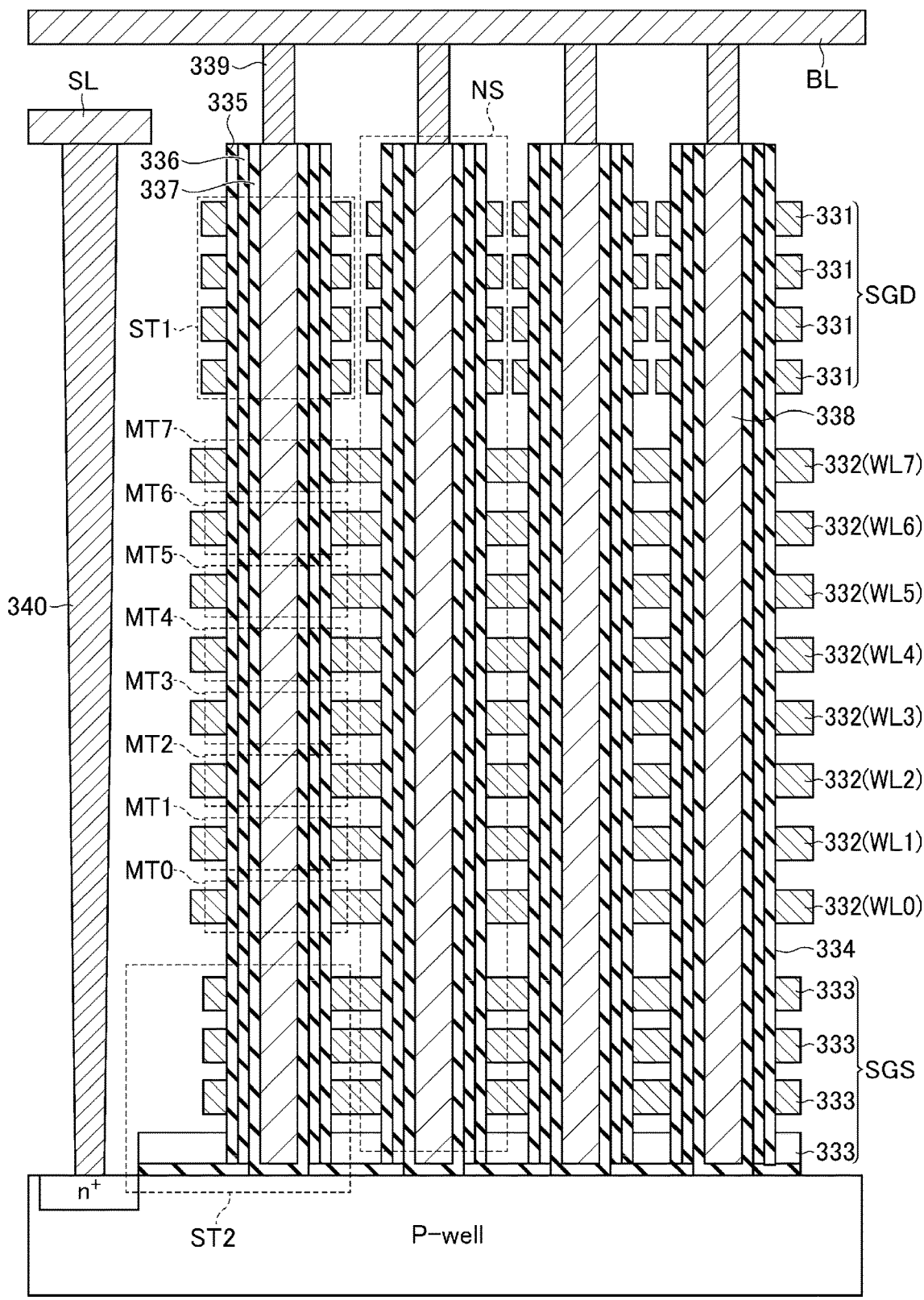
FIG. 4 is a cross-sectional view illustrating the configuration of the memory cell array.

FIG. 4 illustrates a schematic cross-sectional view of the configuration of the memory cell array 110. As illustrated in the figure, in the memory cell array 110, the plurality of NAND strings NS are formed on a p-type well region (P-well) of the silicon substrate. Above the p-type well region, a plurality of wiring layers 333 functioning as the select gate line SGS, a plurality of wiring layers 332 functioning as the word line WL, and a plurality of wiring layers 331 functioning as the select gate line SGD are stacked. An insulating layer (not illustrated) is arranged between the stacked wiring layers 333, 332, and 331.

A plurality of memory holes 334 are formed in the memory cell array 110. The memory hole 334 is a hole penetrating the wiring layers 333, 332, and 331 and an insulating layer (not illustrated) between the wiring layers in the vertical direction and reach the p-type well region. A block insulating film 335, a charge storage layer 336, and a gate insulating film 337 are sequentially formed on the side surface of the memory hole 334, and a conductive column 338 is further formed inside the gate insulating film 337. The conductor column 338 is made of, for example, polysilicon and functions as a region where channels are formed during the operation of the memory cell transistors MT and the select transistors ST1 and ST2 in the NAND string NS. As described above, a columnar body configured with the block insulating film 335, the charge storage layer 336, the gate insulating film 337, and the conductive column 338 is formed in the memory hole 334.

Among the columnar bodies formed in the memory hole 334, each portion intersecting each of the stacked wiring layers 333, 332, and 331 functions as a transistor. Among the plurality of transistors, the transistor in the portion intersecting with the wiring layer 331 functions as the select transistor ST1. Among the plurality of transistors, the transistor in the portion intersecting the wiring layer 332 functions as the memory cell transistors MT (MT0 to MT7). Among the plurality of transistors, the transistor in the portion intersecting the wiring layer 333 functions as the select transistor ST2. With such a configuration, each of the columnar bodies formed in each memory hole 334 functions as the NAND string NS described with reference to FIG. 3. The conductive column 338 in the columnar body is a portion that functions as a channel of the memory cell transistor MT and the select transistors ST1 and ST2.

A wiring layer that functions as a bit line BL is formed above the conductive column 338. A contact plug 339 that connects the conductive column 338 and the bit line BL is formed at the upper end of the conductive column 338.

Furthermore, an n+ type impurity diffusion layer and a p+ type impurity diffusion layer (not illustrated) are formed on the surface of the p-type well region. A contact plug 340 is formed on the n+ type impurity diffusion layer, and a wiring layer that functions as the source line SL is formed on the contact plug 340.

A plurality of components similar to the components illustrated in FIG. 4 are arranged along the depth direction of the paper surface of FIG. 4. One string unit SU is formed by a set of NAND strings NS arranged in a plane that extends in the depth direction of the paper surface of FIG. 4.

The description will be continued by returning to FIG. 2. The sense amplifier 120 is a circuit for adjusting the voltage applied to the bit line BL, reading the voltage of the bit line BL, and converting the voltage into data. During the reading of the data, the sense amplifier 120 transfers data read from the memory cell transistor MT onto the bit line BL and transmits the read data to the input/output circuit 21. During the writing of the data, the sense amplifier 120 transmits the write data written via the bit line BL to the memory cell transistor MT. The operation of the sense amplifier 120 is controlled by the sequencer 41 described later.

The row decoder 130 is a circuit configured with a group of switches (not illustrated) for applying a voltage to each of the word lines WL. The row decoder 130 receives a block address and a row address from the register 42, selects the corresponding block BLK based on the block address, and selects the corresponding word line WL based on the row address. The row decoder 130 switches the opening and closing of the above-described switch group so that the voltage from the voltage generation circuit 43 is applied to the selected word line WL. The operation of the row decoder 130 is controlled by the sequencer 41.

The input/output circuit 21 transmits/receives the signal DQ<7:0> and the data strobe signals DQS and /DQS to/from the memory controller 1. The input/output circuit 21 transmits a command and an address in the signal DQ<7:0> to the register 42. In addition, the input/output circuit 21 transmits/receives the write data and the read data to/from the sense amplifier 120.

The logic control circuit 22 receives the chip enable signal /CE, the command latch enable signal CLE, the address latch enable signal ALE, the write enable signal /WE, the read enable signals RE and /RE, and the write protect signal /WP from the memory controller 1. In addition, the logic control circuit 22 transmits the ready busy signal /RB to the memory controller 1 to notify the state of the semiconductor storage device 2 to the outside.

The sequencer 41 controls the operation of each portion including the memory cell array 110 based on the control signals input from the memory controller 1 to the input/output circuit and the logic control circuit 22. The sequencer 41 corresponds to the "control circuit" in the present embodiment. Both the sequencer 41 and the logic control circuit 22 may also be regarded as the "control circuit" in the present embodiment.

The register 42 is a portion that temporarily stores the command or the address. The register 42 stores commands for instructing the write operation, the read operation, the erase operation, and the like. The command is input from the memory controller 1 to the input/output circuit 21 and, after that, transmitted from the input/output circuit 21 to the register 42 to be stored.

The register 42 also stores the address corresponding to the above-described command. The address is input from the memory controller 1 to the input/output circuit 21 and, after that, transmitted from the input/output circuit 21 to the register 42 to be stored.

Furthermore, the register 42 also stores status information indicating the operating state of the semiconductor storage device 2. The status information is updated by the sequencer 41 each time according to the operating state of the memory cell array 110 or the like. The status information is output from the input/output circuit 21 to the memory controller 1 as a status signal according to a request from the memory controller 1.

The voltage generation circuit 43 generates a voltage required for each of the data write operation, the read operation, and the erase operation in the memory cell array 110. Such a voltage includes, for example, a voltage applied to each word line WL, a voltage applied to each bit line BL, and the like. The operation of the voltage generation circuit 43 is controlled by the sequencer 41.

The input/output pad group 31 includes a plurality of terminals (also referred to as pads) for transmitting and receiving each signal between the memory controller 1 and the input/output circuit 21. Each terminal is individually provided corresponding to the signal DQ<7:0> and the data strobe signals DQS and /DQS.

The logic control pad group 32 includes a plurality of terminals (pads) for transmitting and receiving each signal between the memory controller 1 and the logic control circuit 22. Each terminal is provided individually corresponding to each of the chip enable signal /CE, the command latch enable signal CLE, the address latch enable signal ALE, the write enable signal /WE, the read enable signals RE and /RE, the write protect signal /WP, and the ready busy signal /RB.

The power input terminal group 33 includes a plurality of terminals for receiving the application of each voltage required for the operation of the semiconductor storage device 2. The voltage applied to each terminal includes power supply voltages Vcc, VccQ, Vpp, and a ground voltage Vss.

The power supply voltage Vcc is a power supply voltage supplied from the outside as an operating power supply and is, for example, a voltage of about 3.3V. The power supply voltage VccQ is, for example, a voltage of 1.2 V. The power supply voltage VccQ is a voltage used when transmitting and receiving signals between the memory controller 1 and the semiconductor storage device 2. The power supply voltage Vpp is a power supply voltage higher than the power supply voltage Vcc and is, for example, a voltage of 12 V.

When writing the data to the memory cell array 110 or erasing the data, a high voltage (VPGM) of about 20 V is required. In one example, instead of boosting the power supply voltage Vcc of about 3.3 V by a booster circuit of the voltage generation circuit 43, the power supply voltage Vpp of about 12 V is boosted. In such a case, the desired voltage can be generated with at a high speed and low power consumption. However, when the semiconductor storage device 2 is used in an environment where a high voltage cannot be supplied, the voltage may not be supplied to the power supply voltage Vpp. Even when the power supply voltage Vpp is not supplied, the semiconductor storage device 2 can execute various operations as long as the power supply voltage Vcc is supplied. That is, the power supply voltage Vcc is a power supply voltage that is supplied to the semiconductor storage device 2 as a standard, and the power supply voltage Vpp is a power supply voltage that may be additionally supplied according to, for example, the usage environment.

Figure 5:
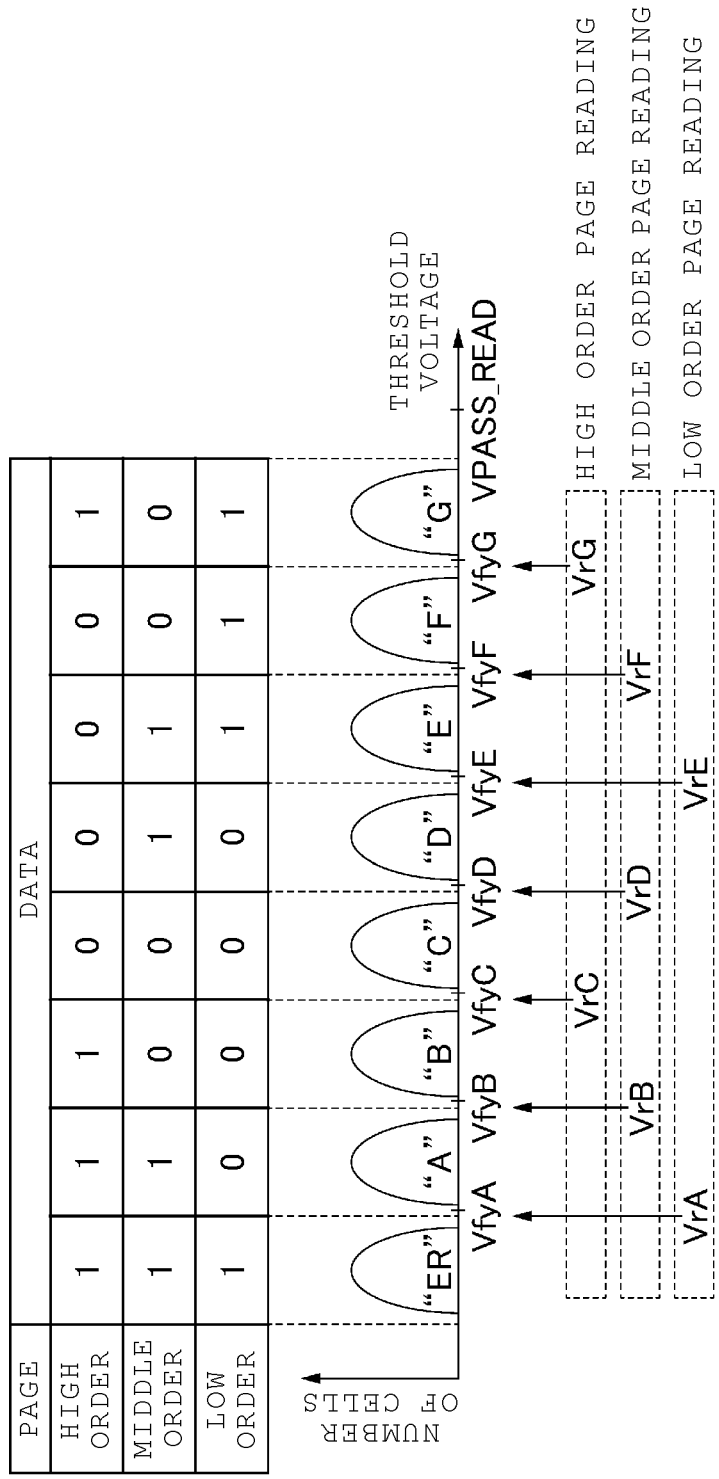
FIG. 5 is a diagram illustrating an example of a threshold voltage distribution of a memory cell transistor.

FIG. 5 is a diagram schematically illustrating a threshold voltage distribution and the like of the memory cell transistor MT. The figure in the middle section of FIG. 5 illustrates the correspondence between the threshold voltage of the memory cell transistor MT (represented by the horizontal axis) and the number of memory cell transistors MT (represented by the vertical axis).

When the TLC method is employed as in the present embodiment, the plurality of memory cell transistors MT form eight threshold voltage distributions as illustrated in the middle section of FIG. 5. These eight threshold voltage distributions (also referred to herein as write levels) are referred to as an "ER" state, an "A" state, a "B" state, a "C" state, a "D" state, an "E" state, an "F" state, and a "G" state in order from the lowest threshold voltage.

The table at the top section of FIG. 5 illustrates an example of data assigned to each of the above-described states of threshold voltage. As illustrated in the table, for example, as illustrated below, different 3-bit data are assigned to the "ER" state, the "A" state, the "B" state, the "C" state, the "D" state, the "E" state, the "F" state, and the "G" state, respectively. "ER" state: "111" ("low order bit/middle order bit/high order bit"), "A" state: "011", "B" state: "001", "C" state: "000", "D" state: "010", "E" state: "110", "F" state: "100", "G" state: "101"

A verify voltage used in the write operation is set between the pair of threshold voltage distributions adjacent to each other. Specifically, the verify voltages VfyA, VfyB, VfyC, VfyD, VfyE, VfyF, and VfyG are set corresponding to the "A" state, the "B" state, the "C" state, the "D" state, the "E" state, the "F" state, and the "G" state, respectively.

The verify voltage VfyA is set between the maximum threshold voltage of the "ER" state and the minimum threshold voltage of the "A" state. When the verify voltage VfyA is applied to the memory cell transistor MT, the memory cell transistors MT of which the threshold voltage is in the "ER" state are turned on, and the memory cell transistors MT of which the threshold voltage is in the threshold voltage distribution of the "A" state or higher are turned off.

Other verify voltages VfyB, VfyC, VfyD, VfyE, VfyF, and VfyG are also set similarly to the above-mentioned verify voltage VfyA. The verify voltage VfyB is set between the "A" state and the "B" state, the verify voltage VfyC is set between the "B" state and the "C" state, the verify voltage VfyD is set between the "C" state and the "D" state, the verify voltage VfyE is set between the "D" state and the "E" state, the verify voltage VfyF is set between the "E" state and the "F" state, and the verify voltage VfyG is set between the "F" state and the "G" state.

For example, the verify voltage VfyA may be set to 0.8 V, the verify voltage VfyB may be set to 1.6 V, the verify voltage VfyC may be set to 2.4 V, the verify voltage VfyD may be set to 3.1 V, the verify voltage VfyE may be set to 3.8 V, the verify voltage VfyF may be set to 4.6 V, and the verify voltage VfyG may be set to 5.6 V, respectively. However, without being limited to this, the verify voltages VfyA, VfyB, VfyC, VfyD, VfyE, VfyF, and VfyG may be appropriately and stepwisely set in the range of, for example, 0 V to 7.0 V.

In addition, a read voltage used in the read operation is set between adjacent threshold voltage distributions. The "read voltage" is a voltage applied to the word line WL connected to the memory cell transistor MT that is the read target, that is, the selected word line during the read operation. In the read operation, data is determined based on a determination result of whether or not the threshold voltage of the memory cell transistor MT that is the read target is higher than the applied read voltage.

As schematically illustrated in the lower section of FIG. 5, specifically, the read voltage VrA for determining whether the threshold voltage of the memory cell transistor MT is in the "ER" state or the "A" state or higher is set between the maximum threshold voltage in the "ER" state and the minimum threshold voltage in the "A" state.

Other read voltages VrB, VrC, VrD, VrE, VrF, and VrG are also set similarly to the read voltage VrA described above. The read voltage VrB is set between the "A" state and the "B" state, the read voltage VrC is set between the "B" state and the "C" state, the read voltage VrD is set between the "C" state and the "D" state, the read voltage VrE is set between the "D" state and the "E" state, the read voltage VrF is set between the "E" state and the "F" state, and the read voltage VrG is set between the "F" state and the "G" state.

A read pass voltage VPASS_READ is set to a voltage higher than the maximum threshold voltage of the highest threshold voltage distribution (for example, "G" state). The memory cell transistor MT of which the read pass voltage VPASS_READ is applied to the gate is turned on regardless of the data stored in the memory cell transistor MT.

It is noted that the verify voltages VfyA, VfyB, VfyC, VfyD, VfyE, VfyF, and VfyG are set to voltages higher than, for example, the read voltages VrA, VrB, VrC, VrD, VrE, VrF, and VrG, respectively. That is, the verify voltages VfyA, VfyB, VfyC, VfyD, VfyE, VfyF, and VfyG are set near the lower ends of the threshold voltage distributions of the "A" state, the "B" state, the "C" state, the "D" state, the "E" state, the "F" state, and the "G" state, respectively.

When the data assignment as described above is employed, one-page data of the low order bits (low order page data) in the read operation can be determined by the read result using the read voltages VrA and VrE. One-page data of the middle order bits (middle order page data) can be determined by the read result using the read voltages VrB, VrD, and VrF. One-page data of the high order bits (high order page data) can be determined by the read result using the read voltages VrC and VrG. In this manner, the low order page data, the middle order page data, and the high order page data are determined by the read operations twice, three times, and twice, respectively. Therefore, the above-described data assignment is called "2-3-2 code".

It is noted that the data assignment as described above is just an example, and the actual data assignment is not limited to this data assignment. For example, 2-bit or 4-bit or more data may be stored in one memory cell transistor MT. In addition, the number of threshold voltage distributions to which data is assigned may be 7 or less or 9 or more.

The write operation performed in the semiconductor storage device 2 will be described. In the write operation, the program operation and the verify operation are performed. The "program operation" is an operation of changing the threshold voltage of the memory cell transistor MT by injecting electrons into the charge storage layer 336 of some memory cell transistors MT. The "verify operation" is an operation of verifying whether or not the threshold voltage of the memory cell transistor MT reaches a target state by reading the data after the above-described program operation. The memory cell transistors MT of which the threshold voltage reaches the target state are subsequently write-inhibited.

In the write operation, the program operation and the verify operation described above are repeatedly executed. Accordingly, the threshold voltage of the memory cell transistor MT is raised up to the target state.

Among the plurality of word lines WL, the word line WL connected to the memory cell transistor MT that is the target of the write operation (that is, the target for changing the threshold voltage) is also referred to as a "selected word line", hereinafter. In addition, the word line WL connected to the memory cell transistor MT that is not the target of the write operation is also referred to as a "non-selected word line", hereinafter. The memory cell transistor MT that is the write target is also referred to as a "selected memory transistor", hereinafter.

Among the plurality of string units SU, the string unit SU that is the target of the write operation is also referred to as a "selected string unit", hereinafter. In addition, the string unit SU that is not the target of the write operation is also referred to as a "non-selected string unit", hereinafter.

The conductive column 338 of each NAND string NS in the selected string unit, that is, each channel in the selected string unit is also referred to as a "selected channel", hereinafter. In addition, the conductive column 338 of each NAND string NS in the non-selected string unit, that is, each channel in the non-selected string unit is also referred to as a "non-selected channel", hereinafter.

Among the plurality of bit lines BL, the bit line BL connected to the selected memory transistor is also referred to as a "selected bit line", hereinafter. In addition, the bit line BL not connected to the selected memory transistor is also referred to as a "non-selected bit line", hereinafter.

Figure 11:
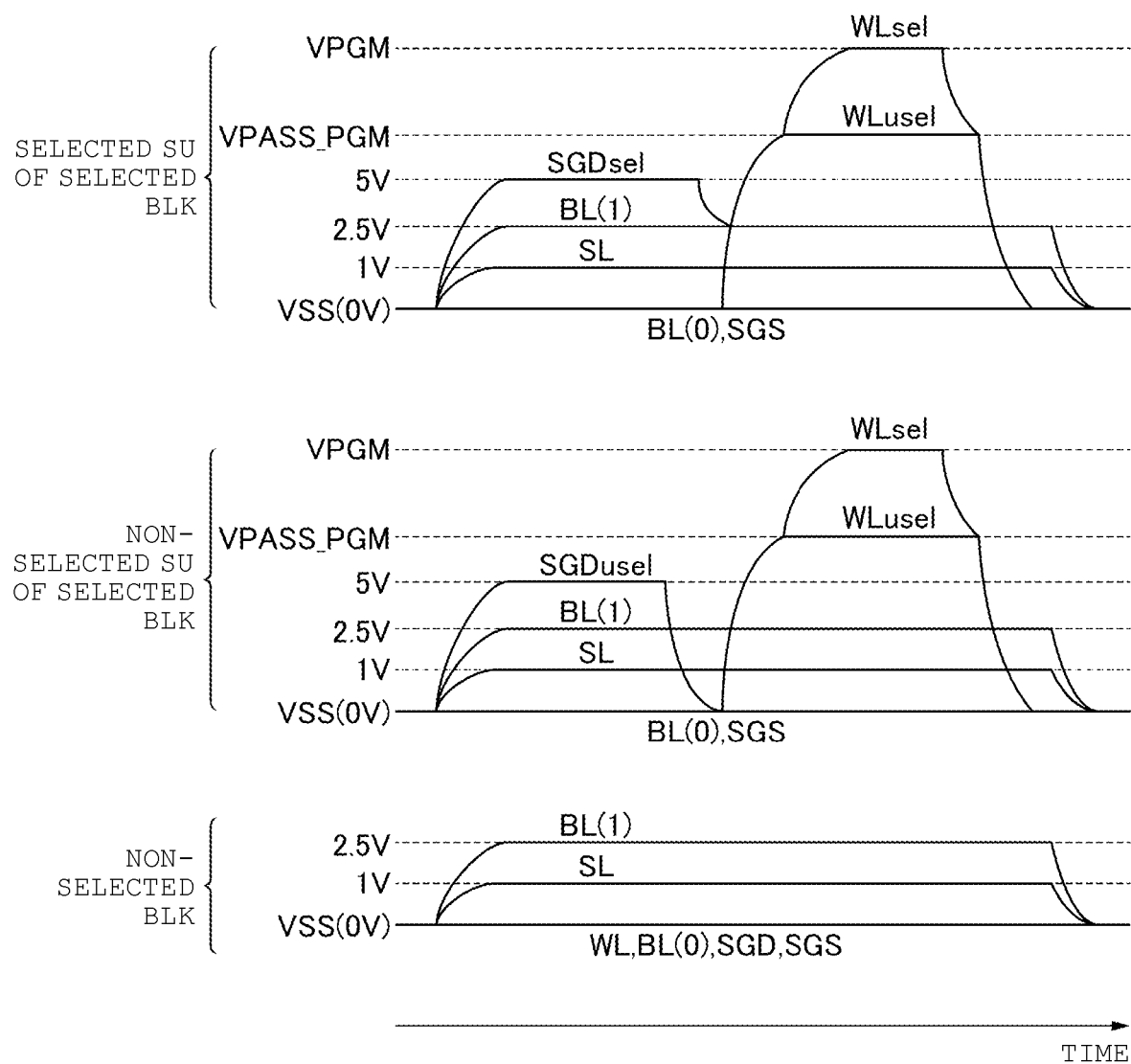
FIG. 11 is a diagram illustrating a voltage change in various wirings during the write operation.

The program operation will be described. FIG. 11 illustrates the voltage change in various wirings during the program operation. In the program operation, the sense amplifier 120 changes the voltage of each bit line BL corresponding to the program data. The ground voltage Vss (for example, 0 V) is applied as an "L" level to the bit line BL connected to the memory cell transistor MT that is the program target (where the threshold voltage is to be raised). For example, 2.5 V is applied as the "H" level to the bit line BL connected to the memory cell transistor MT that is not the program target (where the threshold voltage is to be maintained). The former bit line BL is depicted as "BL(0)" in FIG. 11. The latter bit line BL is depicted as "BL(1)" in FIG. 11.

The row decoder 130 selects one of the blocks BLK as the target of the write operation and further selects one of the string units SU. More specifically, for example, 5 V is applied from the voltage generation circuit 43 to the select gate line SGD in the selected string unit SU (selected select gate line SGDsel) via the row decoder 130. Accordingly, the select transistor ST1 is turned on. On the other hand, for example, the voltage Vss is applied to the select gate line SGS from the voltage generation circuit 43 via the row decoder 130. Accordingly, the select transistor ST2 is turned off.

In addition, for example, a voltage of 5 V is applied from the voltage generation circuit 43 to the select gate line SGD of the non-selected string unit SU (non-selected select gate line SGDusel) in the selected block BLK via the row decoder 130. Accordingly, the select transistor ST1 is turned on. It is noted that, in the string unit SU in each block BLK, the select gate line SGS is commonly connected. Therefore, even in the non-selected string unit SU, the select transistor ST2 is turned off.

Thereafter, the voltage Vss is applied from the voltage generation circuit 43 to the select gate line SGD and the select gate line SGS in the non-selected block BLK via the row decoder 130. Accordingly, the select transistor ST1 and the select transistor ST2 in the non-selected block BLK are turned off.

The source line SL has a voltage higher than the voltage of the select gate line SGS. The voltage is, for example, 1 V.

After that, the voltage of the selected select gate line SGDsel in the selected block BLK is set to, for example, 2.5 V to turn on the select transistor ST1 corresponding to the bit line BL(0) to which 0 V is given in the above-described example and to cut off the select transistor ST1 corresponding to the bit line BL(1) to which 2.5 V is given. Accordingly, in the selected string unit SU, the select transistor ST1 corresponding to the bit line BL (0) is turned on, and the select transistor ST1 corresponding to the bit line BL(1) to which 2.5 V is given is cut off. On the other hand, the voltage of the non-selected select gate line SGDusel is, for example, the voltage Vss. Accordingly, in the non-selected string unit SU, the select transistor ST1 is cut off regardless of the voltages of the bit line BL(0) and the bit line BL(1).

Then, the row decoder 130 selects one of the word lines WL as the target of the write operation in the selected block BLK. For example, a voltage VPGM is applied from the voltage generation circuit 43 to the word line WL (selected word line WLsel) that is the target of the write operation via the row decoder 130. On the other hand, for example, the voltage VPASS_PGM is applied from the voltage generation circuit 43 to the other word line WL (non-selected word line WLusel) via the row decoder 130. The voltage VPGM is a high voltage for injecting electrons into the charge storage layer 336 by a tunnel phenomenon. The voltage VPASS_PGM is a voltage that turns on the memory cell transistor MT connected to the word line WL but does not change the threshold voltage. VPGM is of a higher voltage than VPASS_PGM.

In the NAND string NS corresponding to the bit line BL(0) that is the program target, the select transistor ST1 is turned on. For this reason, the channel voltage of the memory cell transistor MT connected to the selected word line WL becomes 0 V. The voltage difference between the control gate and the channel is increased, and as a result, since electrons are injected into the charge storage layer 336, the threshold voltage of the memory cell transistor MT is raised.

In the NAND string NS corresponding to the bit line BL(1) that is not the program target, the select transistor ST1 is cut off. For this reason, the channel of the memory cell transistor MT connected to the selected word line WL is in an electrically floating state, and thus, the channel voltage is raised up to near the voltage VPGM by capacitive coupling with the word line WL or the like. The voltage difference between the control gate and the channel is decreased, and as a result, since electrons are not injected into the charge storage layer 336, the threshold voltage of the memory cell transistor MT is maintained. Precisely speaking, the threshold voltage is not increased sufficiently that the threshold voltage distribution state transitions to a higher threshold voltage distribution state.

Figure 12:
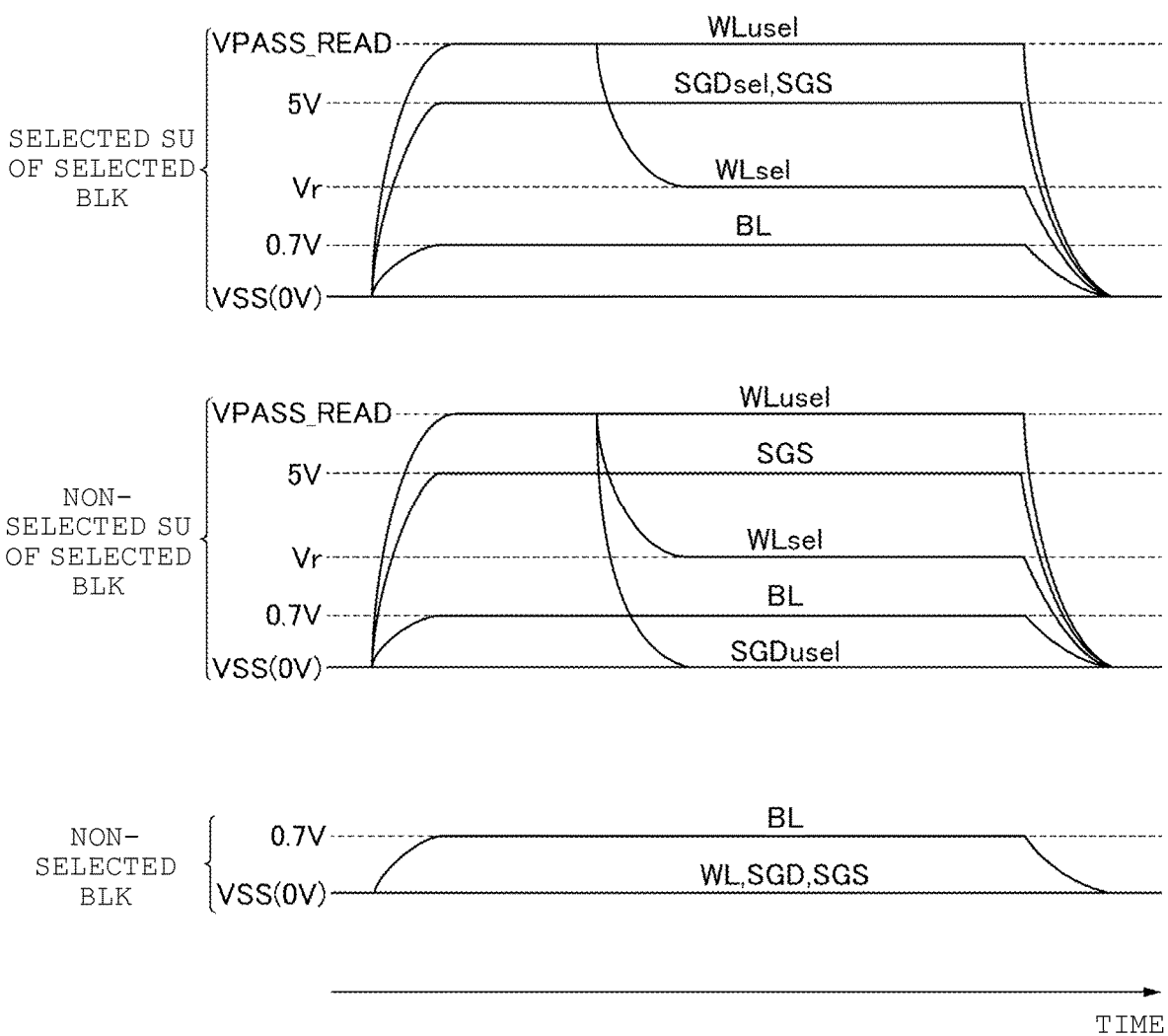
FIG. 12 is a diagram illustrating a voltage change in various wirings during a read operation.

The read operation will be described. This description for the read operation also applies to the verify operation except as described below. FIG. 12 illustrates the voltage change in various wirings during the read operation. In the read operation, the NAND string NS including the memory cell transistor MT that is the target of the read operation, is selected. Alternatively, the string unit SU including the page that is the target of the read operation is selected.

First, for example, 5 V is applied from the voltage generation circuit 43 to the selected select gate line SGDsel, the non-selected select gate line SGDusel, and the select gate line SGS via the row decoder 130. Accordingly, the select transistor ST1 and the select transistor ST2 in the selected block BLK are turned on. In addition, for example, the read pass voltage VPASS_READ is applied from the voltage generation circuit 43 to the selected word line WLsel and the non-selected word line via the row decoder 130. The read pass voltage VPASS_READ is a voltage that can turn on the memory cell transistor MT regardless of the threshold voltage of the memory cell transistor MT and does not change the threshold voltage. Accordingly, the current is conducted in all the NAND strings NS in the selected block BLK regardless of whether the selected string unit SU or the non-selected string unit SU is used.

Next, a read voltage Vr such as VrA is applied from the voltage generation circuit 43 via the row decoder 130 to the word line WL connected to the memory cell transistor MT that is the target of the read operation (the selected word line WLsel). The read pass voltage VPASS_READ is applied to the other word lines (non-selected word lines WLusel).

In addition, while maintaining the voltage applied to the selected select gate line SGDsel and the select gate line SGS, for example, the voltage Vss is applied to the non-selected select gate line SGDusel from the voltage generation circuit 43 via the row decoder 130. Accordingly, the select transistor ST1 in the selected string unit SU is maintained to be turned on, but the select transistor ST1 in the non-selected string unit SU is turned off. It is noted that the select transistor ST2 in the selected block BLK is turned on regardless of whether the selected string unit SU or the non-selected string unit SU is used.

Accordingly, the NAND string NS in the non-selected string unit SU does not form a current path because at least the select transistor ST1 is turned off. On the other hand, in the NAND string NS in the selected string unit SU, a current path is formed or not formed according to the relationship between the read voltage Vr applied to the selected word line WLsel and the threshold voltage of the memory cell transistor MT.

The sense amplifier 120 applies a voltage to the bit line BL connected to the selected NAND string NS. In this state, the sense amplifier 120 reads data based on the value of the current flowing through the bit line BL. Specifically, it is determined whether or not the threshold voltage of the memory cell transistor MT that is the target of the read operation is higher than the read voltage applied to the memory cell transistor MT. It is noted that the data reading may be performed not based on the value of the current flowing through the bit line BL but based on the time change of the voltage in the bit line BL. In the latter case, the bit line BL is pre-charged so as to have a predetermined voltage in advance.

The verify operation described above is also performed similarly to the read operation as described above. In the verify operation, the verify voltage such as VfyA is applied from the voltage generation circuit 43 to the word line WL connected to the memory cell transistor MT that is a verify target via the row decoder 130.

It is noted that, in some cases, the operation of applying a voltage of 5 V to the selected select gate line SGDsel and the non-selected select gate line SGDusel in the initial stage of the program operation described above may be omitted. Similarly, in some cases, the operation of applying a voltage of 5 V to the non-selected select gate line SGDusel and applying the read pass voltage VPASS_READ to the selected word line WLsel in the initial stage of the read operation (or the verify operation) described above may be omitted.

FIGS. 6A to 6G schematically illustrate the voltage changes in various wirings during the write operation in the embodiment. FIG. 6A illustrates an example of a time change of the current supplied from the voltage generation circuit 43 to the memory cell array 110 in order to change the voltage of each word line WL. The current is also referred to as "Icc", hereinafter.

A line L01 in FIG. 6B illustrates an example of a time change of the voltage in the selected select gate line SGDsel. The voltage is also referred to as "V_SGD_sel", hereinafter. In addition, a line L02 of the FIG. 6B illustrates an example of a time change of the voltage in the non-selected select gate line SGDusel. The voltage is also referred to as "V_SGD_usel", hereinafter.

FIG. 6C illustrates an example of a time change of the voltage in the selected word line WLsel. The voltage is also referred to as "V_WL_sel", hereinafter. FIG. 6D illustrates an example of a time change of the voltage in the non-selected word line WLusel. The voltage is also referred to as "V_WL_usel", hereinafter.

FIG. 6E illustrates an example of a time change of the voltage in the selected channel belonging to the selected string unit corresponding to the selected select gate line SGDsel. The voltage is also referred to as "V_Ch_sel", hereinafter. Among the voltages, a line L11 illustrates an example of a time change of the voltage in the selected channel that is not connected to the selected memory transistor (in other words, the selected channel that is connected to the non-selected bit line). A line L12 illustrates an example of a time change of the voltage in the selected channel that is connected to the selected memory transistor (in other words, the selected channel that is connected to the selected bit line).

FIG. 6F illustrates an example of a time change of the voltage in the bit line BL. The voltage is also referred to as "V_BL", hereinafter. Among the voltages, a line L21 illustrates an example of a time change of the voltage in the non-selected bit line among the plurality of bit lines BL. A line L22 illustrates an example of a time change of the voltage in the selected bit line among the plurality of bit lines BL.

FIG. 6G illustrates an example of a time change of the voltage in the non-selected channel belonging to the non-selected string unit corresponding to the non-selected select gate line SGDusel. The voltage is also referred to as "V_Ch_usel", hereinafter. Among the voltages, a line L31 illustrates an example of a time change of the voltage of the non-selected channel that is connected to the non-selected bit line. A line L32 illustrates an example of a time change of the voltage of the non-selected channel that is connected to the selected bit line.

Figure 6:
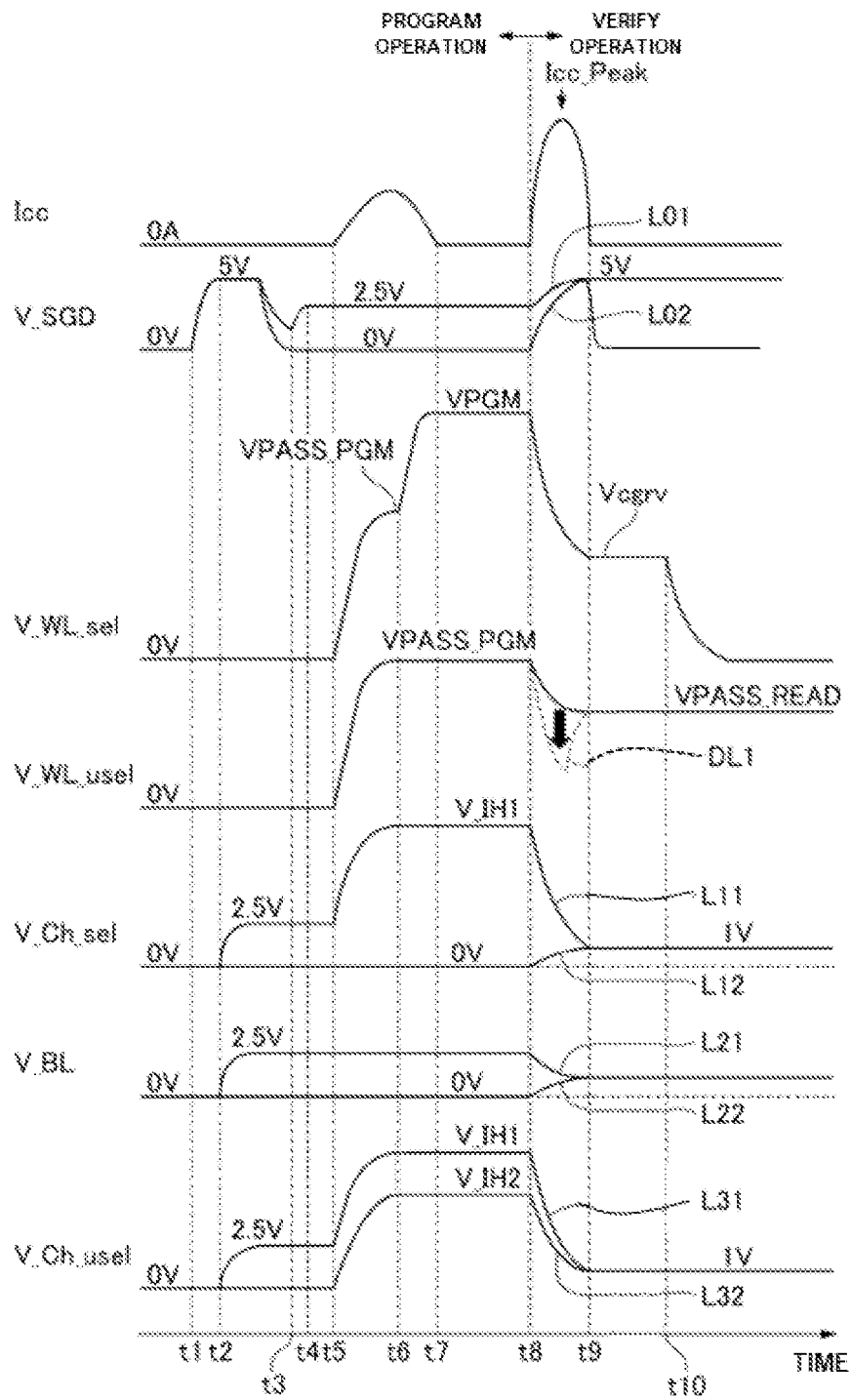
FIGS. 6A to 6G are diagrams illustrating voltage changes in various wirings during a write operation.

In the example of FIG. 6, the program operation is started at the time t1. The sequencer 41 raises V_SGD_sel (the line L01) and V_SGD_usel (the line L02) from, for example, 0 V to 5 V in the period from the time t1 to the time t2. Accordingly, each select transistor ST1 of the selected string unit and each select transistor ST1 of the non-selected string unit are turned on respectively.

At the time t2, the sequencer 41 raises the voltage of the non-selected bit line up to 2.5 V as illustrated by the line L21 in FIG. 6F. Accordingly, the voltage in the selected channel that is connected to the non-selected bit line is raised up to 2.5 V as illustrated by the line L11 in FIG. 6E. It is noted that, although not illustrated, the select transistor ST2 is turned off during the period when the program operation is being performed.

Then, after the sequencer 41 once lowers V_SGD_sel (the line L01), the sequencer 41 changes V_SGD_sel to 2.5 V and changes V_SGD_usel (the line L02) to 0 V in the period from the time t3 to the time t4 (in FIG. 6B).

As illustrated in FIGS. 6B and 6F, after the time t4, V_SGD_sel has voltage equal to the voltage (2.5 V). For this reason, the select transistor ST1 connected to the non-selected bit line in the selected string unit is cut off to be turned off. On the other hand, V_SGD_sel (the line L01) is higher than the voltage (0 V) in the selected bit line. For this reason, the select transistor ST1 connected to the selected bit line in the selected string unit is turned on. It is noted that, since V_SGD_usel (the line L02) is lower than the voltage (2.5 V) in the non-selected bit line and is a voltage equal to the voltage (0 V) in the selected bit line, all the select transistors ST1 in the non-selected string unit are turned off.

As a result, the selected channel that is connected to the non-selected bit line is in a floating state after the time t4. On the other hand, the selected channel that is connected to the selected bit line is in a conductive state with the selected bit line after the time t4.

After that, in the period from the time t5 to the time t6, the sequencer raises each voltage of the word line WL up to VPASS_PGM. VPASS_PGM is a voltage having a magnitude such that the memory cell transistor MT is turned on regardless of the threshold voltage of the memory cell transistor MT and is, for example, 10 V. As illustrated in FIGS. 6C and 6D, at the time t6, both V_WL_sel and V_WL_usel are in a state of rising up to VPASS_PGM. As illustrated in FIG. 6A, after the time t5, Icc is temporarily increased as the voltage of the word line WL is increased.

The selected channel that is connected to the non-selected bit line is in a floating state as described above. In the state, when the voltage of each word line WL is raised up to VPASS_PGM, the voltage of the selected channel is also raised due to the capacitive coupling between the word line WL and the selected channel. The voltage V_Ch_sel of the selected channel that is connected to the non-selected bit line is raised up to V_IH1, for example, as illustrated by the line L11 in FIG. 6E. V_IH1 has a voltage approximately equal to that of VPASS_PGM. The voltage V_Ch_usel of the non-selected channel that is connected to the non-selected bit line is also raised up to V_IH1 as illustrated by the line L31 in FIG. 6G. That is, the voltage V_Ch_usel of the non-selected channel that is connected to the non-selected bit line illustrated by the line L31 in FIG. 6G is changed so as to be substantially equal to the voltage V_Ch_sel of the selected channel that is connected to the non-selected bit line illustrated by the line L11 in FIG. 6E.

It is noted that the non-selected channel that is connected to the selected bit line is also in a floating state similarly to the non-selected channel that is connected to the non-selected bit line. In the state, when the voltage of each word line WL is raised up to VPASS_PGM, the voltage of the non-selected channel is also raised due to the capacitive coupling between the word line WL and the non-selected channel. The voltage V_Ch_usel of the non-selected channel that is connected to the selected bit line is raised up to V_IH2 as illustrated by the line L32 in FIG. 6G. V_IH2 has a voltage substantially equal to that of VPASS_PGM, and has a voltage lower than V_IH1.

The selected channel that is connected to the selected bit line goes into a conductive state with the selected bit line BL as described above. For the reason, even when the voltage of each word line WL is raised up to VPASS_PGM, the voltage of the selected channel is not raised and remains 0 V as illustrated by the line L12 in FIG. 6E.

At the time t6, when the voltage of each word line WL has been raised up to VPASS_PGM, the sequencer 41 further raises the voltage of the selected word line V_WL_sel up to VPGM. VPGM is a voltage having a magnitude such that the threshold voltage of the memory cell transistor MT is raised and is, for example, 20 V. The voltage of the non-selected word line is maintained at VPASS_PGM.

Figure 7:
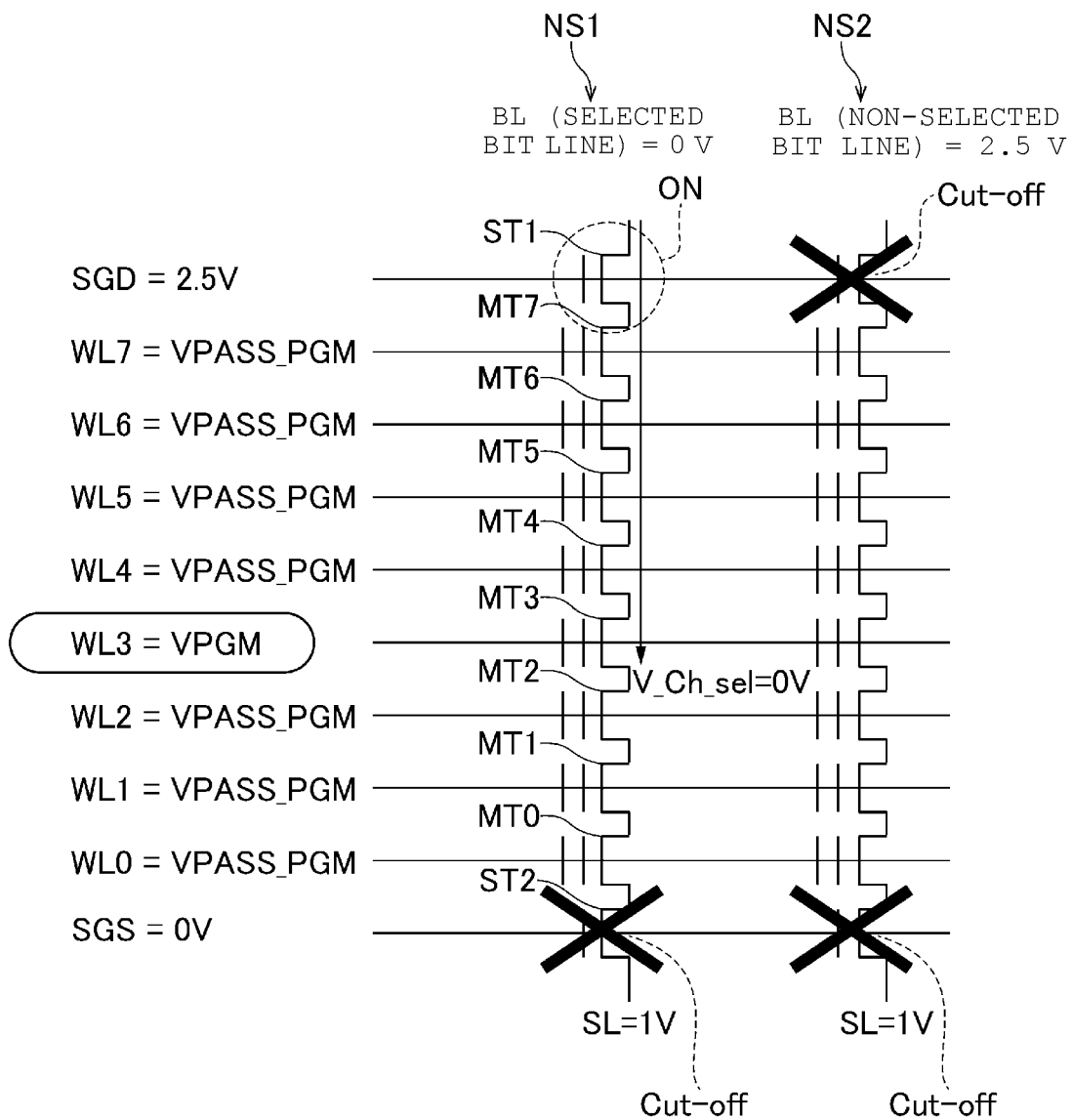
FIG. 7 is an equivalent circuit diagram illustrating a state of a NAND string during the write operation.

FIG. 7 illustrates an equivalent circuit diagram of the state of the NAND string NS at this time. The pair of NAND strings NS1 and NS2 illustrated in FIG. 7 belong to the same selected string unit. The NAND string NS1 is connected to the selected bit line, and the NAND string NS2 is connected to the non-selected bit line. In the example of FIG. 7, the memory cell transistor MT3 of the NAND string NS1 is the target of the write operation.

After the time t7, in the NAND string NS1, the select transistor ST1 and the memory cell transistor MT are turned on, and the select transistor ST2 is turned off. For the reason, the voltage V_Ch_sel of the selected channel that is connected to the selected bit line is 0 V.

Among the NAND strings NS1, in the memory cell transistors MT0 to MT2 and MT4 to MT7 that are not the targets of the writing, the voltage difference between the non-selected word line (VPASS_PGM) connected to the gate and the selected channel (0 V) in the gate is about 10 V. For this reason, these memory cell transistors MT are only turned on, and the threshold voltages of the memory cell transistors MT are not changed.

On the other hand, in the NAND string NS1, in the memory cell transistor MT3 that is the target of the writing, the voltage difference between the selected word line (VPGM) connected to the gate and the selected channel (0 V) in the gate is a relatively high 20 V. For this reason, the threshold voltage of the memory cell transistor MT3 is changed, and data is written.

In the NAND string NS2 connected to the non-selected bit line, as described above, both the select transistors ST1 and ST2 are turned off. For the reason, the selected channel that is connected to the non-selected bit line is in a floating state. The voltage difference between the word line WL (VPASS_PGM or VPGM) connected to the gate of each memory cell transistor MT and the selected channel (V_IH1) in the gate falls within a range of about 0 V to 10 V. For the reason, these memory cell transistors MT are only turned on, and the threshold voltages of the memory cell transistors MT are not changed. The same applies to the NAND string NS belonging to the non-selected string unit, and the threshold voltage of each memory cell transistor MT in the NAND string NS is not changed.

As described above, when the program operation is executed, the plurality of selected channels in the selected string unit are divided into the selected channels which are maintained at 0 V and the selected channels that are raised up to V_IH1. The channel maintained at 0 V, that is, the channel that is connected to the memory cell transistor MT to which the data is written is also referred to as a "channel PG", hereinafter. In addition, the channel that is raised up to V_IH1, that is, the channel that is not connected to the memory cell transistor MT to which data is written is also referred to as a "channel IH", hereinafter. Each of the number of channels PG and the number of channels IH belonging to the selected string unit is changed each time according to the data written on the page and the number of times of loop described later.

It is noted that all of the plurality of non-selected channels in the non-selected string unit are raised up to at least V_IH2 in the program operation. That is, in the program operation, the voltage V_Ch_usel of the non-selected channel that is connected to the selected bit line is raised up to V_IH2, and the voltage V_Ch_usel of the non-selected channel that is connected to the non-selected bit line is raised up to V_IH1 higher than V_IH2. Each of the number of non-selected channels of which voltage is raised up to V_IH2 and the number of non-selected channels of which voltage is raised up to V_IH1 belonging to the non-selected string unit is also changed each time according to the data written on the page and the number of times of loop.

The description will be continued by returning to FIG. 6. At the time t7, when the voltage V_WL_sel of the selected word line is set to VPGM, the data is written as described above. The state continues for a certain period of time until the time t8. The program operation ends at the time t8, and after that, the verify operation is performed.

In the verify operation, the sequencer 41 raises the voltage V_SGD in the select gate line SGD up to, for example, 5 V (FIG. 6B). In addition, the sequencer 41 changes the voltage V_BL of the bit line BL to, for example, 1 V (FIG. 6F). It is noted that such switching of V_BL is performed for both the selected bit line and the non-selected bit line.

At the same time, the sequencer 41 changes the voltage V_WL_sel in the selected word line from VPGM to Vcgrv (FIG. 6C). Vcgrv is a voltage having a magnitude selected from VfyA, VfyB, and the like in FIG. 5 according to the state that is the verify target. A method of setting the state that is the verify target will be described later.

In addition, the sequencer 41 also changes the voltage V_WL_usel in the non-selected word line from VPASS_PGM to VPASS_READ (FIG. 6D). VPASS_READ is a voltage having a magnitude such that the memory cell transistor MT is turned on regardless of the threshold voltage of the memory cell transistor MT and is, for example, 5 V.

The voltage change of each wiring as described above is performed substantially simultaneously by the sequencer 41 in the period from the time t8 to the time t9 when the verify operation is started.

After time t9, the select transistor is turned on as V_SGD is raised up to 5 V, and the respective bit lines BL and the selected channel are in a conductive state. For the reason, both V_Ch_sel and V_Ch_usel are changed so as to be 1 V, which is the same as the voltage of the bit line BL.

In the state of time t9, when the threshold voltage of the memory cell transistor MT that is the verify target is higher than Vcgrv, the memory cell transistor MT is turned off, and no current flows through the channel PG including the memory cell transistor MT. On the other hand, when the threshold voltage of the memory cell transistor MT that is the verify target is lower than Vcgrv, the memory cell transistor MT is turned on, and a current flows through the channel PG including the memory cell transistor MT. Each current value can be detected by the sense amplifier 120. The sequencer 41 can determine whether or not the threshold voltage of the memory cell transistor MT has reached the target state based on the current flowing through the channel PG.

It is noted that the example of FIGS. 6A to 6G is an example in which the verify operation is performed for a single state. That is, after V_WL_sel illustrated in FIG. 6C is set to Vcgrv at the time t9, the verify operation is performed only for a single state corresponding to the voltage. As described later, after the time t9, Vcgrv may be adjusted to be changed stepwisely, and verify operations may be performed for the plurality of states in accordance with each step.

Figure 8:
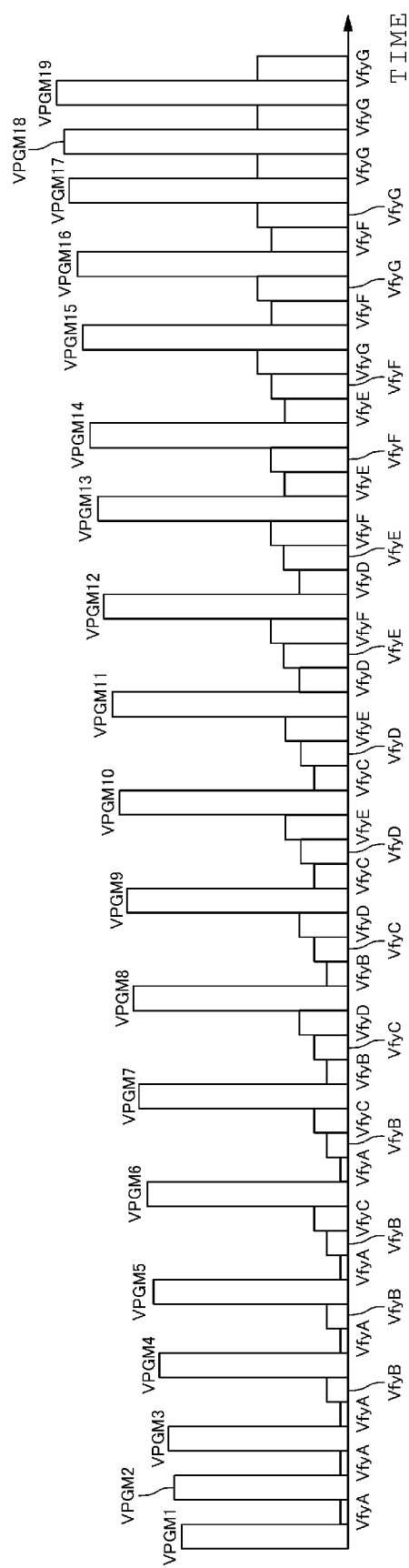
FIG. 8 is a diagram illustrating a voltage change in a selected word line during the write operation.

The specific flow of the entire write operation will be described. In the write operation, the program operation and the verify operation described above are repeated until it is confirmed that the data has been written correctly. FIG. 8 illustrates an example in which the data is written by repeating the combination of the program operation and the verify operation nineteen times. Each operation repeated in this manner is also referred to as a "loop", hereinafter.

FIG. 8 illustrates an example of the voltage change in the selected word line during the write operation. As illustrated in FIG. 8, the above-described loop is executed nineteen times to the maximum. It is noted that "VPGM1" illustrated in FIG. 8 is VPGM applied to the selected word line in the first loop. "VPGM2" is VPGM applied to the selected word line in the second loop. Similarly, VPGMs applied to the selected word line in the respective loops are described as "VPGM3", "VPGM4", . . . , "VPGM19" in FIG. 8. As illustrated in FIG. 8, each time the loop is repeated, the value of VPGM is stepped up so as to be gradually increased.

FIG. 9A illustrates the target state of the verify operation performed in each loop. In addition, FIG. 9B illustrates the target state of the program operation performed in each loop. It is noted that "1" illustrated in FIG. 9B denotes that the write operation at the state is not performed, and "0" denotes that the write operation at the state is performed. In addition, "0/1" denotes that the write operation at the state is basically performed, but when the verifying is passed during the previous write operation, the write operation is not performed.

As illustrated in FIGS. 8, 9A and 9B, in the first loop, after VPGM1 is applied to the selected word line in the program operation, the verify operation is performed only for the "A" state. That is, during the verify operation, the verify voltage VfyA is applied to the selected word line, and the verify voltages VfyB to VfyG are not applied.

It is noted that the memory cell transistors MT that are the program targets in the first loop are all the memory cell transistors MT of which the threshold voltage is to finally reach the "A" state or higher. On the other hand, the memory cell transistors MT that are the verify targets at the "A" state in the first loop are the memory cell transistors MT of which the threshold voltage is to be finally the "A" state. The memory cell transistors MT of which the threshold voltage is to be finally the "B" state or higher are excluded from the verify target at the "A" state.

In the second loop, after VPGM2 is applied to the selected word line, the program operation and the verify operation similar to those in the first loop are performed. However, among the memory cell transistors MT of which the threshold voltage is to be finally the "A" state, the memory cell transistors MT that pass the verification at the "A" state in the first loop are excluded from the targets of the program operation and the verify operation in the second loop. That is, in the second loop, the memory cell transistors MT of which the threshold voltage is to be finally the "B" state or higher and the memory cell transistors MT that fail the verification in the previous loop are set as the targets of the program operation.

In the third loop, after VPGM3 is applied to the selected word line and the program operation is performed, the verify operation is performed for the "A" state and the "B" state. That is, during the verify operation, the verify voltages VfyA and VfyB are sequentially applied to the selected word line, and the verify voltages VfyC to VfyG are not applied to the selected word line.

It is noted that the memory cell transistors MT that are the program targets in the third loop are all the memory cell transistors MT of which the threshold voltage is to finally reach the "B" state or higher and the memory cell transistors MT that fail the verification in the previous loop. In addition, the memory cell transistors MT that are the verify targets at the "A" state in the third loop are the memory cell transistors MT that fail the verification in the previous loop among the memory cell transistors MT of which the threshold voltage is to be finally the "A" state. The memory cell transistors MT that are the verify targets at the "B" state in the third loop are the memory cell transistors MT of which the threshold voltage is to be finally the "B" state.

In the fourth loop, after VPGM4 is applied to the selected word line, the program operation and the verify operation similar to those in the third loop are performed. However, among the memory cell transistors MT of which the threshold voltage is to be finally the "A" state, the memory cell transistors MT that pass the verification at the "A" state in the third loop are excluded from the targets of the program operation and the verify operation in the second loop. Similarly, the memory cell transistors MT that pass the verification at the "B" state in the third loop are excluded from the targets of the program operation and the verify operation in the fourth loop. That is, in the fourth loop, the memory cell transistors MT of which the threshold voltage is to be finally the "C" state or higher and the memory cell transistors MT that fail the verification in the previous loop are set as the targets of the program operation.

Similarly, in the subsequent loops, after the program operation, the verify operation at each predetermined state as illustrated in FIG. 7 is performed. The memory cell transistors MT of which the threshold voltage is to finally reach the target state are excluded from the targets of the program operation and the verify operation in the next and subsequent loops.

As the loop is repeated, the number of memory cell transistors MT of which the threshold voltage reaches the final target state is increased, so that the number of memory cell transistors MT that are excluded from the targets of the program operation and the verify operation is gradually increased. This point is also reflected in the fact that the number of states marked with "1" is increased and the number of states marked with "0" is increased as the number of times of loop is increased in FIG. 9B.

Among the plurality of NAND strings NS in the memory cell array 110, the NAND string including the memory cell transistor MT that changes the threshold voltage in the program operation, that is, the NAND string NS corresponding to the above-mentioned "channel PG" is also referred to as a "program target string". As the loop is repeated, the number of program target strings is gradually decreased. In other words, as the loop is repeated, the number of NAND string NS corresponding to the above-mentioned "channel IH" is gradually increased.

As described above, in the write operation executed by the sequencer 41 of the present embodiment, the number of program target strings in the program operation of the last loop is smaller than the number of program target strings in the program operation of the first loop.

It is noted that, as illustrated in FIGS. 9A and 9B, the verify operation on the "A" state is completed in the sixth loop. This is because it is empirically required that the program to the "A" state is substantially completed by, for example, six times of loop. Similarly, the verify operation on the "B" state is completed in the eighth loop, the verify operation on the "C" state is completed in the tenth loop, the verify operation on the "D" state is completed in the twelfth loop, the verify operation on the "E" state is completed in the fourteenth loop, the verify operation on the "F" state is completed in the sixteenth loop, and the verify operation on the "G" state is completed in the nineteenth loop. The number of times of the verify operation executed for each state may differ from this example.

The problems that may occur in the above-mentioned write operation will be described with reference to FIGS. 6A to 6G again. As described above, after the time t8 when the verify operation is started, the sequencer 41 changes the voltage V_WL_usel in the non-selected word line from VPASS_PGM to VPASS_READ (FIG. 6D).

Since the word line WL and the conductive column 338 (that is, the channel) are separated from each other via the gate insulating film 337 or the like, the word line WL and the conductive column 338 configure a capacitor. That is, a capacitance component exists between each word line WL and the memory cell transistor MT. As described above, in changing V_WL_usel from VPASS_PGM to VPASS_READ, a portion of the electric charges stored in the non-selected word line during the program operation is used for the verify operation.

With respect to the changing of V_WL_usel after the time t8, smoothly changing from VPASS_PGM to VPASS_READ as illustrated in FIG. 6D is ideal. When V_WL_usel is changed in this manner, the current supplied from the voltage generation circuit 43 to the non-selected word line, that is, Icc in FIG. 6A can be reduced to a small value.

However, with respect to the actual changing of V_WL_usel, as illustrated by a dotted line DL1 in FIG. 6D, V_WL_usel may be changed so as to be decreased to a voltage lower than VPASS_READ and, after that, raised up to VPASS_READ. This is because V_WL_usel also is decreased at the same time when the voltage V_Ch_sel of the selected channel that is connected to the non-selected bit line drops sharply as illustrated by the line L11 in FIG. 6E, due to the capacitive coupling between the word line WL and the conductive column 338. This is also because V_WL_usel also is decreased at the same time when the voltage V_Ch_usel of the non-selected channel drops sharply as illustrated by the line L31 and the line L32 in FIG. 6G, due to the capacitive coupling between the word line WL and the conductive column 338. In particular, the voltage V_Ch_usel of the non-selected channel that is connected to the non-selected bit line drops more sharply than the voltage V_Ch_usel of the non-selected channel that is connected to the selected bit line.

Among all the channels of the NAND string NS in the selected block BLK, a sharp drop in voltage after the time t8 when a verification process is started occurs in the voltage V_Ch_sel of the selected channel that is connected to the non-selected bit line illustrated by the line L11 in FIG. 6E and the voltage V_Ch_usel of the non-selected channel that is connected to the non-selected bit line illustrated by the line L31 in FIG. 6G. That is, a sharp drop in voltage after the time t8 when the verification process is started occurs in the NAND string NS that is not connected to the selected bit line corresponding to the selected memory transistor that is the program target among all the NAND strings NS in the selected block BLK. Therefore, as the number of selected memory transistors that are the program targets is decreased, the number of selected bit lines is decreased, and when the number of non-selected bit lines is increased, the amount of decrease in V_WL_usel as illustrated by the dotted line DL1 in FIG. 6D is increased. In this case, the current to be supplied from the voltage generation circuit 43 is increased in order to compensate for the voltage drop of the non-selected word line. For the reason, as illustrated in FIG. 6A, Icc is temporarily increased after the time t8, and the maximum value, Icc_Peak, becomes large.

The memory controller 1 illustrated in FIG. 1 supplies an operating power to each of the plurality of semiconductor storage devices 2 provided. For the reason, when Icc_Peak is rapidly increased in some of the semiconductor storage devices 2, there is a possibility that it is not possible to normally supply the operating power to the other semiconductor storage devices 2. In addition, there is a possibility that the memory controller 1 is damaged by a large current. Therefore, it is preferable to maintain Icc_Peak as small as possible immediately after the verify operation is started.

Therefore, the sequencer 41 according to the present embodiment reduces Icc_Peak by adjusting the rate of voltage increase when V_WL_usel is changed to VPASS_READ.

Figure 10A:
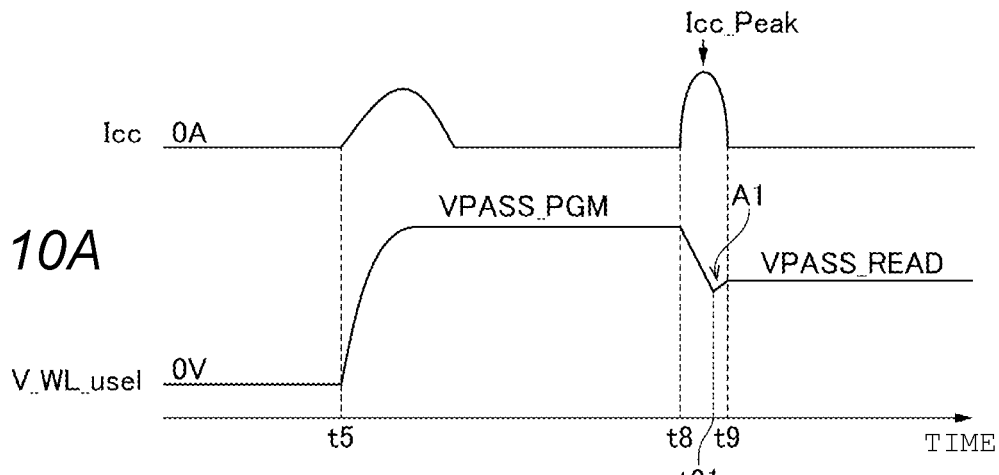
FIGS. 10A to 10C are diagrams illustrating a voltage change in a non-selected word line during the write operation.

A specific method for adjusting the rate of voltage increase of V_WL_usel will be described with reference to FIGS. 10A to 10C. FIG. 10A illustrates an example of a time change of Icc and V_WL_usel when the first loop is executed. In this example, similarly to the example of FIG. 6, the program operation is performed in the period up to the time t8, and the verify operation is performed in the period after the time t8. The same applies to the examples of FIGS. 10B and 10C described later.

Also in the example in FIG. 10A, V_WL_usel is temporarily decreased after the time t8. Specifically, V_WL_usel is decreased in the period from the time t8 to the time t21, and V_WL_usel is increased in the period from the time t21 to the time t9. After time t9, V_WL_usel becomes VPASS_READ.

As described with reference to FIG. 8 and the like, as the loop is repeated, the number of memory cell transistors MT of which the threshold voltage reaches the final target state is increased, so that the number of memory cell transistors MT that are excluded from the targets of the program operation and the verify operation is gradually increased. That is, the number of selected channels that drop sharply as illustrated by the line L11 in FIG. 6E and the number of non-selected channels that drop sharply as illustrated by the line L31 in FIG. 6G are gradually increased as the loop is repeated.

In other words, in the first loop, the number of selected channels that drop sharply as illustrated by the line L11 in FIG. 6E and the number of non-selected channels that drop sharply as illustrated by the line L31 in FIG. 6G are the smallest. For the reason, in the example in FIG. 10A, the amount of decrease in V_WL_usel in the period from the time t8 to the time t21 is the smallest. In this case, even when the rate of increase of V_WL_usel after the time t21 is large, Icc_Peak does not become too large.

Therefore, in the first loop, the sequencer 41 controls the operation of the voltage generation circuit 43 so that the rate of increase of V_WL_usel after the time t21 is relatively large. Specifically, the sequencer 41 controls the operation of the DA converter (not illustrated) in the voltage generation circuit 43, so that V_WL_usel is increased by a small amount each time a predetermined control cycle elapses, and the value of the V_WL_usel approaches VPASS_READ. The sequencer 41 adjusts the above-mentioned "small amount" so that the average slope (that is, the rate of increase) of V_WL_usel after the time t21 becomes A1.

Figure 10B:
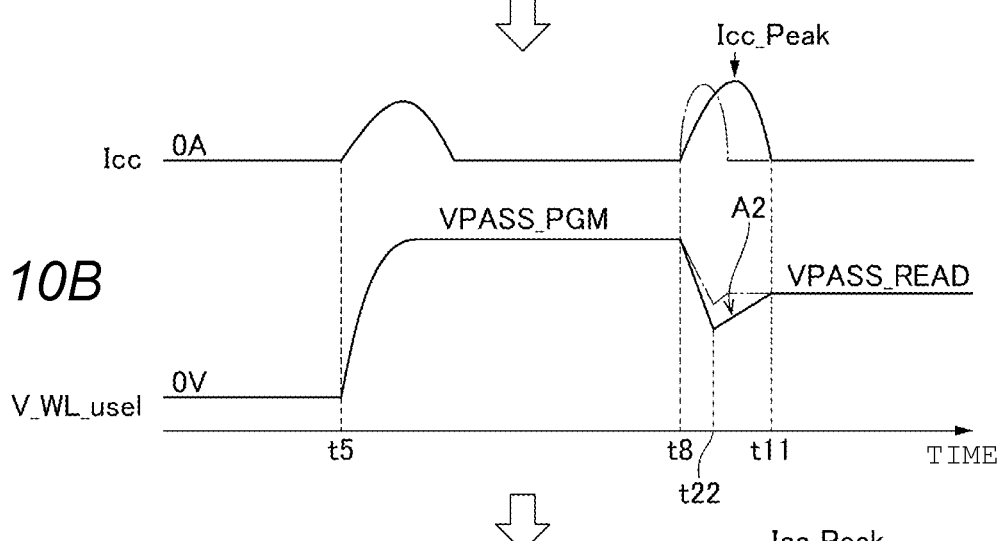

FIG. 10B illustrates an example of a time change of Icc and V_WL_usel, for example, when the tenth loop is executed. In the example as well, V_WL_usel is temporarily decreased after the time t8.

As in the example, when the write operation is completed by about half, the number of selected channels that drop sharply as illustrated by the line L11 in FIG. 6E and the number of non-selected channels that drop sharply as illustrated by the line L31 in FIG. 6G are further increased than that in the first loop in FIG. 10A. As a result, the amount of decrease in V_WL_usel after the time t8 is larger than that in the case of FIG. 10A. In the example, V_WL_usel is decreased in the period from the time t8 to the time t22.

When V_WL_usel is increased at the slope A1 similar to that in FIG. 10A after the time t22, Icc_Peak becomes larger than that in the case of FIG. 10A.

Therefore, in the tenth loop, the sequencer 41 controls the operation of the voltage generation circuit 43 so that the rate of increase of V_WL_usel after the time t22 is smaller than that in the case of FIG. 10A. Specifically, the sequencer 41 performs adjustment so that the average slope (that is, the rate of increase) of V_WL_usel after the time t23 becomes A2. A2 has a slope smaller than A1. As a result of such adjustment, the value of Icc_Peak in the example in FIG. 10B is reduced to substantially the same state as the value of Icc_Peak in the example in FIG. 10A. It is noted that, in FIG. 10B, the changes in Icc and V_WL_usel in the example in FIG. 10A are illustrated by one-dot dashed lines.

In the example in FIG. 10B, the time when the value of V_WL_usel reaches VPASS_READ is the time t11. The period from the time t8 to the time t11 is longer than the period from the time t8 to the time t9 in the example in FIG. 10A.

Figure 10C:
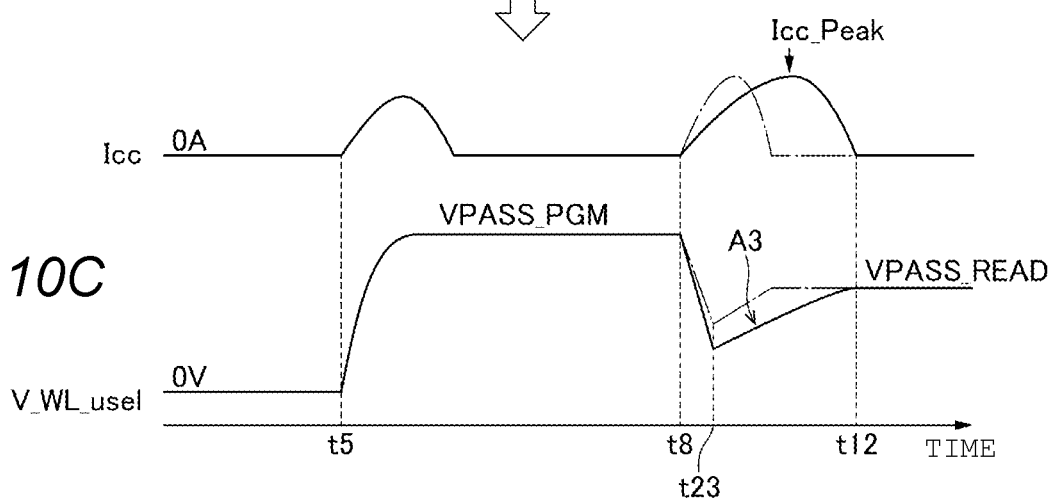

FIG. 10C illustrates an example of a time change of Icc and V_WL_usel, for example, when the nineteenth loop is executed. In the example, V_WL_usel is temporarily decreased after the time t8.

As in the example, in the last loop of the write operation, the number of selected channels that drop sharply as illustrated by the line L11 in FIG. 6E and the number of non-selected channels that drop sharply as illustrated by the line L31 in FIG. 6G are further increased than that in the tenth loop in FIG. 10B. As a result, the amount of decrease in V_WL_usel after the time t8 is even larger than in the case of FIG. 10B. In the example, V_WL_usel is decreased in the period from the time t8 to the time t23.

When V_WL_usel is increased at the slope A2 similar to that in FIG. 10B after the time t23, Icc_Peak becomes larger than that in FIG. 10B.

Therefore, in the nineteenth loop, the sequencer 41 controls the operation of the voltage generation circuit 43 so that the rate of increase of V_WL_usel after the time t23 is further smaller than that in the case of FIG. 10B. Specifically, the sequencer 41 performs adjustment so that the average slope (that is, the rate of increase) of V_WL_usel after the time t23 becomes A3. A3 has a slope smaller than A2. As a result of such adjustment, the value of Icc_Peak in the example in FIG. 10C is reduced to substantially the same state as the value of Icc_Peak in the examples of FIGS. 10A and 10B. It is noted that, in FIG. 10C, the changes in Icc and V_WL_usel in the example in FIG. 10B are illustrated by one-dot dashed lines.

In the example in FIG. 10C, the time when the value of V_WL_usel reaches VPASS_READ is the time t12. The period from the time t8 to the time t12 is longer than the period from the time t8 to the time t11 in the example in FIG. 10B.

As described above, in the semiconductor storage device 2 according to the present embodiment, the sequencer 41 which is the control circuit controls the operation of the voltage generation circuit 43 so that the rate of increase (A3) of the voltage applied to the non-selected word line in the verify operation of the last loop is smaller than the rate of increase (A1) of the voltage applied to the non-selected word line in the verify operation of the first loop.

By performing such control, even when the number of selected channels that are sharply decreased as illustrated by the line L11 in FIG. 6E and the number of non-selected channels that are sharply decreased as illustrated by the line L31 in FIG. 6G are increased by repeating the loop, it is possible to reduce Icc_Peak associated with the charging of the word line WL. Accordingly, it is possible to reduce the load on the memory controller 1.

It is noted that the timing at which the rate of increase of the voltage applied to the non-selected word line is changed, that is, the timing at which the slope A1 in FIG. 10A is switched to the slope A2 in FIG. 10B, and the timing at which the slope A2 in FIG. 10B is switched to the slope A3 in FIG. 10C may be set to any timing.

In addition, the number of times of the changes of the rate of increase of the voltage applied to the non-selected word line may be set to any number. For example, a total of 19 loops may be divided into two loops, that is, the first half loop and the second half loop. After that, in the first half loop, the rate of increase of the voltage may be adjusted so as to be the slope A1 in FIG. 10A, and in the second half loop, the rate of increase of the voltage may be adjusted so as to be the slope A3 in FIG. 10C.

The rate of increase of the voltage applied to the non-selected word line may be changed each time the loop is executed. In this case, the sequencer 41 controls the operation of the voltage generation circuit 43 so that the rate of increase of the voltage applied to the non-selected word line in the verify operation is gradually decreased each time the loop is repeated.

The rate of increase of the voltage applied to the non-selected word line during the verify operation may be set each time according to the number of program target strings during the program operation executed immediately before the verify operation. That is, when the number of program target strings during the program operation is decreased as compared with the number in the previous loop, the rate of increase of voltage during the subsequent verify operation may be allowed to be smaller than the rate of increase in the previous loop. In this manner, when the number of program target strings in the program operation is decreased, the sequencer 41 may reduce the rate of increase of the voltage applied to the non-selected word line in the subsequent verify operation.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a memory cell array including a plurality of memory cell transistors;
   a plurality of word lines connected to gates of the memory cell transistors;
   a voltage generation circuit configured to generate a voltage applied to each of the word lines; and
   a control circuit configured to control an operation of the memory cell array and the voltage generation circuit during a write operation for writing data to the memory cell array that includes multiple loops of a program operation and a verify operation, wherein the control circuit is configured to control the operation of the voltage generation circuit during the write operation so that a rate of increase of a voltage applied to a non-selected word line at a beginning of the verify operation is different for at least two of the loops.

2. The semiconductor storage device according to claim 1, wherein the rate of increase of the voltage applied to the non-selected word line at the beginning of the verify operation of a first loop is higher than the rate of increase of the voltage applied to the non-selected word line at the beginning of the verify operation of a second loop, which is executed later than the first loop.

3. The semiconductor storage device according to claim 2, wherein the first loop is executed before all of the other loops of the multiple loops and the second loop is executed after all of the other loops of the multiple loops.

4. The semiconductor storage device according to claim 3, wherein another loop of the multiple loops is executed after the first loop and before the second loop, and the rate of increase of the voltage applied to the non-selected word line at the beginning of the verify operation of the another loop is lower than the rate of increase of the voltage applied to the non-selected word line at the beginning of the verify operation of the first loop and higher than the rate of increase of the voltage applied to the non-selected word line at the beginning of the verify operation of the second loop.

5. The semiconductor storage device according to claim 1, wherein the control circuit controls the operation of the voltage generation circuit so that the rate of increase of the voltage applied to the non-selected word line at the beginning of the verify operation is gradually decreased each time the loop is repeated.

6. The semiconductor storage device according to claim 1, wherein
   the memory cell array includes a plurality of strings in which the plurality of memory cell transistors are electrically connected in series, and
   when the strings including the memory cell transistors of which a threshold voltage is changed during the program operation among the plurality of strings are set as program target strings, the control circuit performs the write operation so that the number of the program target strings in the program operation of later loops is smaller than the number of the program target strings in the program operation of earlier loops.

7. The semiconductor storage device according to claim 6, wherein
   the control circuit determines the number of the program target strings for a next loop, and
   when the number of the program target strings in the program operation has decreased from a prior loop, the control circuit decreases the rate of increase of the voltage applied to the non-selected word line at the beginning of the verify operation of the next loop.

8. The semiconductor storage device according to claim 1, wherein
   the control circuit controls the operation of the voltage generation circuit so that a first pass voltage applied to the non-selected word line while a program voltage is applied to the memory cell transistors that are write targets during the program operation, is higher than a second pass voltage applied to the non-selected word line while a read voltage is applied to the memory cell transistors that are write targets during the verify operation.

9. The semiconductor storage device according to claim 8, wherein
   the memory cell array includes a plurality of strings in which the plurality of memory cell transistors are electrically connected in series, and
   at the beginning of the verify operation, a channel voltage of each of the memory cell transistors that are electrically connected in series to the memory cell transistors that are write targets is decreased to a level lower than the second pass voltage.

10. The semiconductor storage device according to claim 9, wherein the channel voltage is decreased to 1 V and the second pass voltage is 5 V.

11. A method of performing a write operation in a semiconductor storage device comprising a memory cell array including a plurality of memory cell transistors and a plurality of word lines connected to gates of the memory cell transistors, said method comprising:
    executing multiple loops of a program operation and a verify operation to write data in the memory cell transistors, wherein
    a rate of increase of a voltage applied to a non-selected word line at a beginning of the verify operation is controlled to be different for at least two of the loops.

12. The method according to claim 11, wherein the rate of increase of the voltage applied to the non-selected word line at the beginning of the verify operation of a first loop is higher than the rate of increase of the voltage applied to the non-selected word line at the beginning of the verify operation of a second loop, which is executed later than the first loop.

13. The method according to claim 12, wherein the first loop is executed before all of the other loops of the multiple loops and the second loop is executed after all of the other loops of the multiple loops.

14. The method according to claim 13, wherein another loop of the multiple loops is executed after the first loop and before the second loop, and the rate of increase of the voltage applied to the non-selected word line at the beginning of the verify operation of the another loop is lower than the rate of increase of the voltage applied to the non-selected word line at the beginning of the verify operation of the first loop and higher than the rate of increase of the voltage applied to the non-selected word line at the beginning of the verify operation of the second loop.

15. The method according to claim 11,
the rate of increase of the voltage applied to the non-selected word line at the beginning of the verify operation is gradually decreased each time a next loop is executed.

16. The method according to claim 11, wherein
the memory cell array includes a plurality of strings in which the plurality of memory cell transistors are electrically connected in series, and
when the strings including the memory cell transistors of which a threshold voltage is changed during the program operation among the plurality of strings are set as program target strings, a control circuit of the semiconductor storage device performs the write operation so that the number of the program target strings in the program operation of later loops is smaller than the number of the program target strings in the program operation of earlier loops.

17. The method according to claim 16, wherein
the control circuit determines a number of the program target strings for a next loop, and
when the number of the program target strings in the program operation has decreased from a prior loop, the control circuit decreases the rate of increase of the voltage applied to the non-selected word line at the beginning of the verify operation of the next loop.

18. The method according to claim 11, wherein
a first pass voltage applied to the non-selected word line while a program voltage is applied to the memory cell transistors that are write targets during the program operation, is higher than a second pass voltage applied to the non-selected word line while a read voltage is applied to the memory cell transistors that are write targets during the verify operation.

19. The method according to claim 18, wherein
the memory cell array includes a plurality of strings in which the plurality of memory cell transistors are electrically connected in series, and
at the beginning of the verify operation, a channel voltage of each of the memory cell transistors that are electrically connected in series to the memory cell transistors that are write targets is decreased to a level lower than the second pass voltage.

20. The method according to claim 19, wherein the channel voltage is decreased to 1 V and the second pass voltage is 5 V.

* * * * *